United States Patent
Fujii et al.

(10) Patent No.: US 10,438,951 B2
(45) Date of Patent: Oct. 8, 2019

(54) SEMICONDUCTOR DEVICE AND MANUFACTURING METHOD THEREOF

(71) Applicant: ASAHI KASEI MICRODEVICES CORPORATION, Tokyo (JP)

(72) Inventors: Shuntaro Fujii, Tokyo (JP); Tatsushi Yagi, Tokyo (JP); Shohei Hamada, Tokyo (JP)

(73) Assignee: ASAHI KASEI MICRODEVICES CORPORATION, Tokyo (JP)

( * ) Notice: Subject to any disclaimer, the term of this patent is extended or adjusted under 35 U.S.C. 154(b) by 0 days.

(21) Appl. No.: 15/921,056

(22) Filed: Mar. 14, 2018

(65) Prior Publication Data

US 2018/0277438 A1    Sep. 27, 2018

(30) Foreign Application Priority Data

Mar. 24, 2017 (JP) ................................. 2017-059701
Dec. 27, 2017 (JP) ................................. 2017-251717

(51) Int. Cl.
*H01L 27/092* (2006.01)
*H01L 21/8234* (2006.01)
(Continued)

(52) U.S. Cl.
CPC ........ *H01L 27/0922* (2013.01); *H01L 21/266* (2013.01); *H01L 21/8238* (2013.01);
(Continued)

(58) Field of Classification Search
CPC . H01L 2027/11844; H01L 2027/11837; H01L 2924/141; H01L 2924/143;
(Continued)

(56) References Cited

U.S. PATENT DOCUMENTS 6,261,889 B1    7/2001  Ono
8,735,987 B1 *  5/2014  Hoffmann ........... H01L 27/1116
                                                  257/369
(Continued)

FOREIGN PATENT DOCUMENTS

JP    H08-316465 A    11/1996
JP    2000-269492 A    9/2000
(Continued)

OTHER PUBLICATIONS

Wu et al., "Pocket Implantation Effect on Drain Current Flicker Noise in Analog nMOSFET Devices", IEEE Transactions on Electron Devices, vol. 51, No. 8, Aug. 2004, pp. 1262-1266.
(Continued)

*Primary Examiner* — Eduardo A Rodela
(74) *Attorney, Agent, or Firm* — Morgan, Lewis & Bockius LLP

(57) ABSTRACT

An object of the present invention is to provide a semiconductor device and a manufacturing method thereof that may achieve low power consumption in a digital circuit and reduce influence of noise in an analog circuit. The manufacturing method of the semiconductor device includes a first source/drain forming step of forming a first source region and a first drain region by implanting impurities of a second conductivity type into a digital side second conductivity type impurity layer using a gate electrode and a sidewall as a mask and a second drain/source forming step of forming a second source region and a second drain region by implanting impurities of the second conductivity type into an analog side second conductivity type impurity layer using a gate electrode and a sidewall as a mask more shallowly than the impurities of the second conductivity type implanted in the first source/drain forming step.

12 Claims, 28 Drawing Sheets

(51) Int. Cl.
  *H01L 27/088* (2006.01)
  *H01L 21/266* (2006.01)
  *H01L 29/06* (2006.01)
  *H01L 21/8238* (2006.01)

(52) U.S. Cl.
  CPC ........... *H01L 21/823418* (2013.01); *H01L 21/823481* (2013.01); *H01L 21/823493* (2013.01); *H01L 21/823807* (2013.01); *H01L 21/823814* (2013.01); *H01L 27/088* (2013.01); *H01L 27/092* (2013.01); *H01L 27/0928* (2013.01); *H01L 29/0649* (2013.01); *H01L 21/823412* (2013.01)

(58) Field of Classification Search
  CPC ......... H01L 21/8238; H01L 21/823807; H01L 21/823814; H01L 21/823892; H01L 27/092; H01L 27/0922; H01L 27/0925; H01L 27/0927; H01L 27/0928; H01L 27/118; H01L 27/11807; H01L 29/41733; H01L 29/42384; H01L 29/4908; H01L 29/4925; H01L 29/4958; H01L 29/786
  See application file for complete search history.

(56) References Cited

U.S. PATENT DOCUMENTS

| | | | |
|---|---|---|---|
| 2002/0130369 A1 | 9/2002 | Iwasaki et al. | |
| 2005/0218455 A1 | 10/2005 | Maeda et al. | |
| 2008/0064157 A1* | 3/2008 | Maeda | H01L 21/82341 438/200 |
| 2009/0283837 A1* | 11/2009 | Huebinger | H01L 21/76224 257/369 |
| 2009/0311837 A1* | 12/2009 | Kapoor | H01L 27/0611 438/186 |
| 2011/0042756 A1* | 2/2011 | Hikida | H01L 21/82341 257/392 |

FOREIGN PATENT DOCUMENTS

| | | |
|---|---|---|
| JP | 2002-270699 A | 9/2002 |
| JP | 2008-198889 A | 8/2008 |
| JP | 2009-278031 A | 11/2009 |
| JP | 2012-084636 A | 4/2012 |
| WO | 2012/046365 A1 | 4/2002 |
| WO | 2008/099565 A1 | 8/2008 |

OTHER PUBLICATIONS

Impellizzeri et al., "Role of fluorine in suppressing boron transient enhanced diffusion in preamorphized Si", Applies Physics Letters vol. 84, No. 11, Mar. 15, 2004, pp. 1862-1864.

Tsunomura et al., "Analysis of Extra VT Variability Sources in NMOS Using Takeuchi Plot", 2009 Symposium on VLSI Technology Digest of Technical Papers, 6A-1, pp. 110-111.

* cited by examiner

SEMICONDUCTOR DEVICE AND MANUFACTURING METHOD THEREOF

CROSS REFERENCE TO RELATED APPLICATIONS AND INCORPORATION BY REFERENCE

This application claims benefit of priority under 35 USC 119 based on Japanese Patent Application No. 2017-059701 filed on Mar. 24, 2017 and Japanese Patent Application No. 2017-251717 filed on Dec. 27, 2017, the entire contents of which are incorporated by reference herein.

TECHNICAL FIELD

The present invention relates to a semiconductor device in which both of a digital circuit and an analog circuit are formed and a manufacturing method of the semiconductor device.

BACKGROUND ART

A semiconductor integrated circuit in which both of a digital circuit and an analog circuit are mounted on an identical wafer is known. A digital circuit is expected to achieve high speed, high density, and low power consumption. In order to achieve these goals, miniaturization of a MOS transistor has been attempted in general. Reduction in the gate length of a MOS transistor for the purpose of miniaturization causes threshold voltage to decrease due to short-channel effect and consumed power to rapidly increase. In order to prevent the rapid increase in consumed power, a MOS transistor is, by performing halo implantation, formed so as to increase impurity concentration around an end of the source region and an end of the drain region to a high level. As a result, in a MOS transistor on which halo implantation is performed, reverse short-channel effect occurs in which threshold voltage increases as gate length is shortened.

On the other hand, in an analog circuit, 1/f noise of MOS transistors often influence product performance substantially. The halo implantation, which is regularly performed on a digital circuit, causes 1/f noise to deteriorate. In addition, 1/f noise decreases as device area increases. In a circuit in which the influence of noise cannot be ignored, channel length is intentionally set long. Therefore, in an analog circuit, leakage current is unlikely to become a problem compared with a digital circuit. For this reason, in an analog circuit, the dose amount of impurity ions in halo implantation is sometimes reduced and in other cases halo implantation itself is not performed.

SUMMARY

According to an aspect of the present invention, there is provided a manufacturing method of a semiconductor device, including: forming an element separation layer on a semiconductor substrate; forming a first well layer by implanting impurities of a first conductivity type into a digital circuit forming area of the semiconductor substrate; forming a second well layer by implanting impurities of the first conductivity type into an analog circuit forming area of the semiconductor substrate, which is separated from the digital circuit forming area by the element separation layer; forming a gate insulating film on a surface of the semiconductor substrate; forming a first gate electrode on a surface of the gate insulating film in the digital circuit forming area and forming a second gate electrode on the surface of the gate insulating film in the analog circuit forming area; forming a digital side second conductivity type impurity layer by implanting impurities of a second conductivity type into the first well layer using the first gate electrode as a mask; forming an analog side second conductivity type impurity layer by implanting impurities of the second conductivity type into the second well layer using the second gate electrode as a mask; forming sidewalls made of insulating films on side surfaces of respective ones of the first gate electrode and the second gate electrode; forming a first source region and a first drain region by implanting impurities of the second conductivity type into the digital side second conductivity type impurity layer using the first gate electrode and the sidewall as a mask; forming a second source region and a second drain region by implanting impurities of the second conductivity type into the analog side second conductivity type impurity layer using the second gate electrode and the sidewall as a mask more shallowly than the impurities of the second conductivity type implanted in the forming the first source region and the first drain region; and forming silicide films on surfaces of the first source region, the first drain region, and the first gate electrode and the second source region, the second drain region, and the second gate electrode.

According to another aspect of the present invention, there is provided a manufacturing method of a semiconductor device, including: forming an element separation layer on a semiconductor substrate; forming a first well layer by implanting impurities of a first conductivity type into a digital circuit forming area of the semiconductor substrate; forming a second well layer by implanting impurities of the first conductivity type into an analog circuit forming area of the semiconductor substrate, which is separated from the digital circuit forming area by the element separation layer; forming a non-doped film by selectively growing the non-doped film on a surface of the semiconductor substrate in the analog circuit forming area; forming gate insulating films on a surface of the semiconductor substrate in the digital circuit forming area and a surface of the non-doped film in the analog circuit forming area; forming a first gate electrode on a surface of the gate insulating film in the digital circuit forming area and forming a second gate electrode on a surface of the gate insulating film in the analog circuit forming area; forming a digital side second conductivity type impurity layer and an analog side second conductivity type impurity layer by implanting impurities of a second conductivity type into the first well layer and the non-doped epi-silicon film with a mean range shallower than or equal to thickness of the non-doped film; forming sidewalls made of insulating films on side surfaces of respective ones of the first gate electrode and the second gate electrode; forming a first source region and a first drain region in the digital side second conductivity type impurity layer and forming a second source region and a second drain region in the analog side second conductivity type impurity layer by implanting impurities of the second conductivity type into the digital side second conductivity type impurity layer and the analog side second conductivity type impurity layer using the first gate electrode, the second gate electrode, and the sidewalls as masks; and forming silicide films on surfaces of the first source region, the first drain region, and the first gate electrode and the second source region, the second drain region, and the second gate electrode.

According to still another aspect of the present invention, there is provided a semiconductor device, including: an element separation layer formed on a semiconductor substrate to separate the semiconductor substrate into a digital circuit forming area and an analog circuit forming area; a first well layer of a first conductivity type formed in the digital circuit forming area; a second well layer of the first conductivity type formed in the analog circuit forming area; a first gate insulating film formed on a surface of the first well layer; a second gate insulating film formed on a surface of the second well layer; a first gate electrode formed on a surface of the first gate insulating film; a second gate electrode formed on a surface of the second gate insulating film; sidewalls formed of insulating films on side surfaces of respective ones of the first gate electrode and the second gate electrode; a first source region and a first drain region of a second conductivity type formed in the first well layer with the first gate electrode interposed therebetween; a second source region and a second drain region of the second conductivity type formed in the second well layer with the second gate electrode interposed therebetween and have a shallower depth from a surface of the semiconductor substrate than the first source region and the first drain region; and silicide films formed on surfaces of the first source region, the first drain region, and the first gate electrode and the second source region, the second drain region, and the second gate electrode.

According to yet another aspect of the present invention, there is provided a semiconductor device, including: an element separation layer formed on a semiconductor substrate to separate the semiconductor substrate into a digital circuit forming area and an analog circuit forming area; a first well layer of a first conductivity type formed in the digital circuit forming area; a second well layer of the first conductivity type formed in the analog circuit forming area; a non-doped film formed on a surface of the second well layer; a first gate insulating film formed on a surface of the first well layer; a second gate insulating film formed on a surface of the non-doped film; a first gate electrode formed on a surface of the first gate insulating film; a second gate electrode formed on a surface of the second gate insulating film; sidewalls formed of insulating films on side surfaces of respective ones of the first gate electrode and the second gate electrode; a first source region and a first drain region of a second conductivity type formed in the first well layer with the first gate electrode interposed therebetween; a second source region and a second drain region of the second conductivity type formed in the non-doped film and the second well layer with the second gate electrode interposed therebetween; and silicide films formed on surfaces of the first source region, the first drain region, and the first gate electrode and the second source region, the second drain region, and the second gate electrode.

DETAILED DESCRIPTION

Even when halo implantation is not performed, there is a case where reverse short-channel effect is observed in an N-type MOS transistor. The reverse short-channel effect in such a case is a phenomenon related to interstitial silicon atoms generated by ion implantation performed when the source and drain regions are formed. The phenomenon is referred to as transient enhanced diffusion (TED) of impurities (in particular, boron). The TED causes impurities to segregate around end portions of the source and drain regions. As the amount of overlap between distributions of interstitial silicon generated by ion implantation performed when the extensions or the source and drain regions are formed and boron increases, a larger amount of TED of impurities occur.

An object of Embodiments is to provide a semiconductor device and a manufacturing method of the semiconductor device that enable low power consumption in a digital circuit to be achieved and influence of noise in an analog circuit to be reduced.

The inventors of the claimed invention, through intensive experiments, clarified that high concentration regions of impurities (in particular, boron), formed due to the TED of impurities (in particular, boron), around respective ends of a source region and a drain region deteriorate 1/f noise. However, there is a possibility that suppression of TED with respect to both an analog circuit portion and a digital circuit portion in the same manner causes short-channel effect to be likely to occur in the digital circuit portion, which deteriorates characteristics expected for a digital circuit, such as high speed, high density, and low power consumption.

Hence, the inventors of the claimed invention found that addition of a step dedicated to the analog circuit portion enables the TED of impurities (in particular, boron) to be suppressed with respect to MOS transistors in the analog circuit portion and the noise of MOS transistors used in the analog circuit to be reduced.

Hereinafter, the present invention will be described through embodiments, but it should be understood that the following embodiment does not limit the scope of the invention set forth in the claims to the embodiments. In addition, all combinations of features described in the embodiments are not always indispensable for the solution proposed by the invention.

First Embodiment (Schematic Configuration of Semiconductor Device)

First, a schematic configuration of a semiconductor device according to a first embodiment of the present invention will be described using FIGS. 1 and 2. Hereinafter, in FIGS. 1 and 2, and FIGS. 3 to 15 which illustrate a manufacturing process of the semiconductor device, an illustration of P-type MOS transistors is omitted and only N-type MOS transistors are illustrated.

Figure 1:
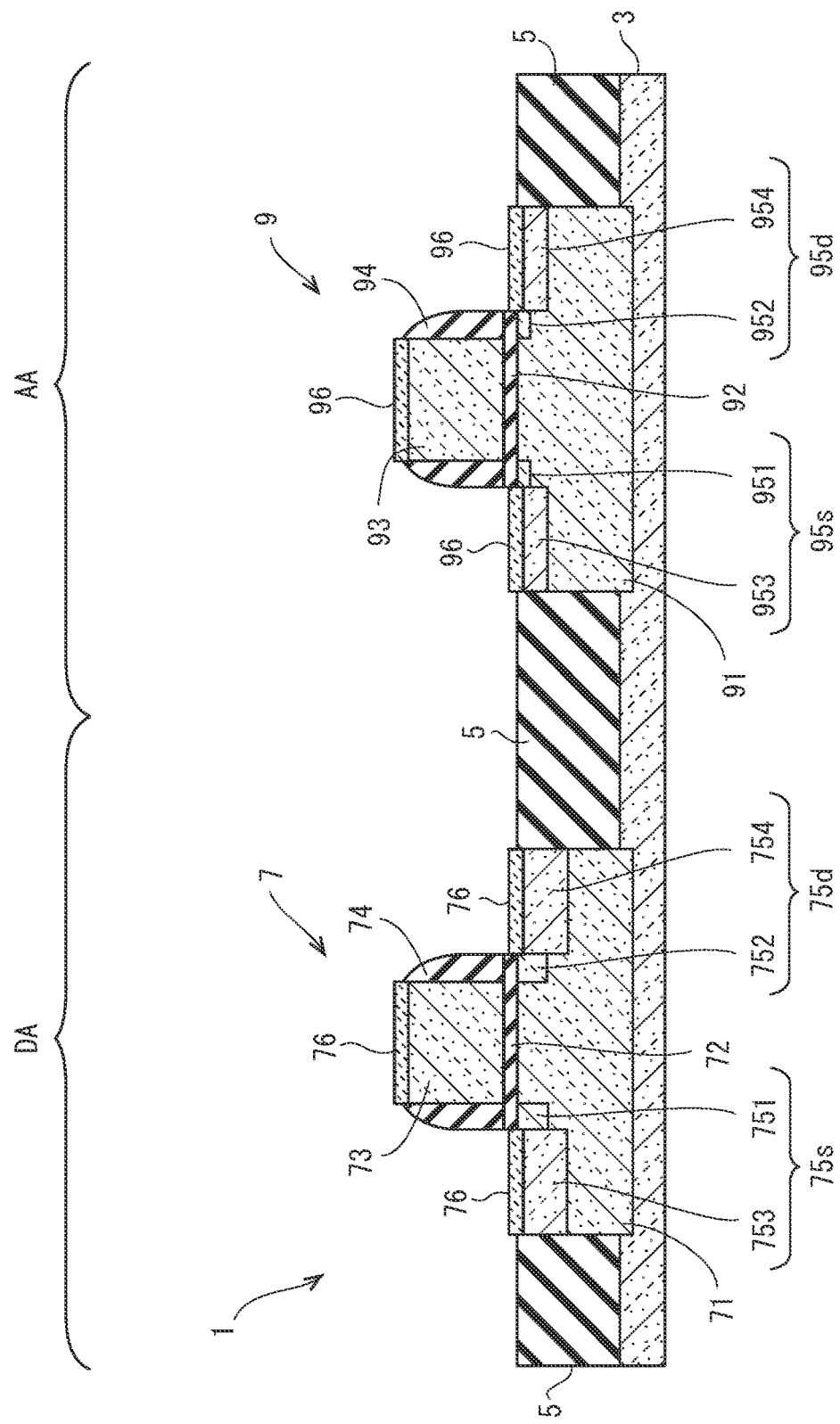
FIG. 1 is a cross-sectional view illustrative of a schematic configuration of a semiconductor device 1 according to a first embodiment of the present invention.

As illustrated in FIG. 1, a semiconductor device 1 according to the present embodiment includes a digital circuit N-type MOS transistor 7 that is formed in a digital circuit forming area DA and an analog circuit N-type MOS transistor 9 that is formed in an analog circuit forming area AA. As described above, the semiconductor device 1 is a semiconductor device in which both of a digital circuit and an analog circuit are formed.

The semiconductor device 1 includes an N-type (an example of a second conductivity type) semiconductor substrate 3. The semiconductor substrate 3 is, for example, an N-type semiconductor substrate or a P-type semiconductor substrate including deep N-wells. The semiconductor device 1 includes element separation layers 5 that are formed on the semiconductor substrate 3 and separate the semiconductor substrate 3 into the digital circuit forming area DA and the analog circuit forming area AA. The element separation layers 5 are formed of, for example, a shallow trench isolation (STI) oxide film or a local oxidation of silicon (LOCOS) oxide film.

The semiconductor device 1 includes a P-type (an example of a first conductivity type) well layer (an example of a first well layer) 71 that is formed in the digital circuit forming area DA and a P-type well layer (an example of a second well layer) 91 that is formed in the analog circuit forming area AA. The well layers 71 and 91 are formed by ion implanting, for example, boron (B) into the semiconductor substrate 3.

The semiconductor device 1 includes a gate insulating film (an example of a first gate insulating film) 72 that is formed on the surface of the well layer 71 and a gate insulating film (an example of a second gate insulating film) 92 that is formed on the surface of the well layer 91. The gate insulating films 72 and 92 are formed of, for example, silicon dioxide ($SiO_2$).

The semiconductor device 1 includes a gate electrode (an example of a first gate electrode) 73 that is formed on the surface of the gate insulating film 72 and a gate electrode (an example of a second gate electrode) 93 that is formed on the surface of the gate insulating film 92. The gate electrodes 73 and 93 are formed of, for example, polysilicon.

The semiconductor device 1 includes sidewalls 74 and 94 that are formed of insulating films on the respective side surfaces of the gate electrodes 73 and 93. The sidewall 74 is formed on the side surface of the gate electrode 73, and the side wall 94 is formed on the side surface of the gate electrode 93. The insulating films that form the sidewalls 74 and 94 are made of, for example, $SiO_2$.

The semiconductor device 1 includes an N-type source region (an example of a first source region) 75s and an N-type drain region (an example of a first drain region) 75d that are formed in the well layer 71 with the gate electrode 73 interposed therebetween. The source region 75s includes an extension region 751 that is formed below the sidewall 74 and a deep source region 753 that is formed adjacent to the extension region 751. The deep source region 753 has a higher concentration of impurities (for example, arsenic (As)) than that in the extension region 751. The drain region 75d includes an extension region 752 that is formed below the sidewall 74 and a deep drain region 754 that is formed adjacent to the extension region 752. The deep drain region 754 has a higher concentration of impurities (for example, arsenic (As)) than that in the extension region 752.

The semiconductor device 1 includes an N-type source region (an example of a second source region) 95s and an N-type drain region (an example of a second drain region) 95d that are formed in the well layer 91 with the gate electrode 93 interposed therebetween and have a shallower depth from the surface of the semiconductor substrate 3 than the source region 75s and the drain region 75d. The source region 95s includes an extension region 951 that is formed below the sidewall 94 and a deep source region 953 that is formed adjacent to the extension region 951. The deep source region 953 has a higher concentration of impurities (for example, arsenic (As)) than that in the extension region 951. The drain region 95d includes an extension region 952 that is formed below the sidewall 94 and a deep drain region 954 that is formed adjacent to the extension region 952. The deep drain region 954 has a higher concentration of impurities (for example, arsenic (As)) than that in the extension region 952. Relationships between the depth of the source region 95s and the drain region 95d and the depth of the source region 75s and the drain region 75d will be described later.

The semiconductor device 1 includes silicide films 76 that are formed on the surfaces of the source region 75s, the drain region 75d, and the gate electrode 73 and silicide films 96 that are formed on the surfaces of the source region 95s, the drain region 95d, and the gate electrode 93. Although illustration is omitted, the semiconductor device 1 includes a protective layer that is formed over the digital circuit N-type MOS transistor 7 and the analog circuit N-type MOS transistor 9, electrode plugs that are embedded in contact halls and formed after removing portions of the protective layer over the source region 75s, the drain region 75d, the gate electrode 73, the source region 95s, the drain region 95d, and the gate electrode 93, and wiring connected to the electrode plugs. The silicide films 76 and 96 are formed to reduce contact resistance with the electrode plugs.

As described above, the digital circuit N-type MOS transistor 7, included in the semiconductor device 1, includes the well layer 71 formed on the semiconductor substrate 3, the gate insulating film 72 formed on a portion of the well layer 71, the gate electrode 73 formed on the gate insulating film 72, the sidewall 74 formed on the side surface of the gate electrode 73, the source region 75s and the drain region 75d formed in the well layer 71 with the gate electrode 73 interposed therebetween, and the silicide films 76 formed on the source region 75s, the drain region 75d, and the gate electrode 73.

In addition, the analog circuit N-type MOS transistor 9, included in the semiconductor device 1, includes the well layer 91 formed on the semiconductor substrate 3, the gate insulating film 92 formed on a portion of the well layer 91, the gate electrode 93 formed on the gate insulating film 92, the sidewall 94 formed on the side surface of the gate electrode 93, the source region 95s and the drain region 95d formed in the well layer 91 with the gate electrode 93 interposed therebetween, and the silicide films 96 formed on the source region 95s, the drain region 95d, and the gate electrode 93.

Next, relationships between the depth of the source region 95s and the drain region 95d of the analog circuit N-type MOS transistor 9 and the depth of the source region 75s and the drain region 75d of the digital circuit N-type MOS transistor 7 will be described using FIG. 2.

Figure 2:
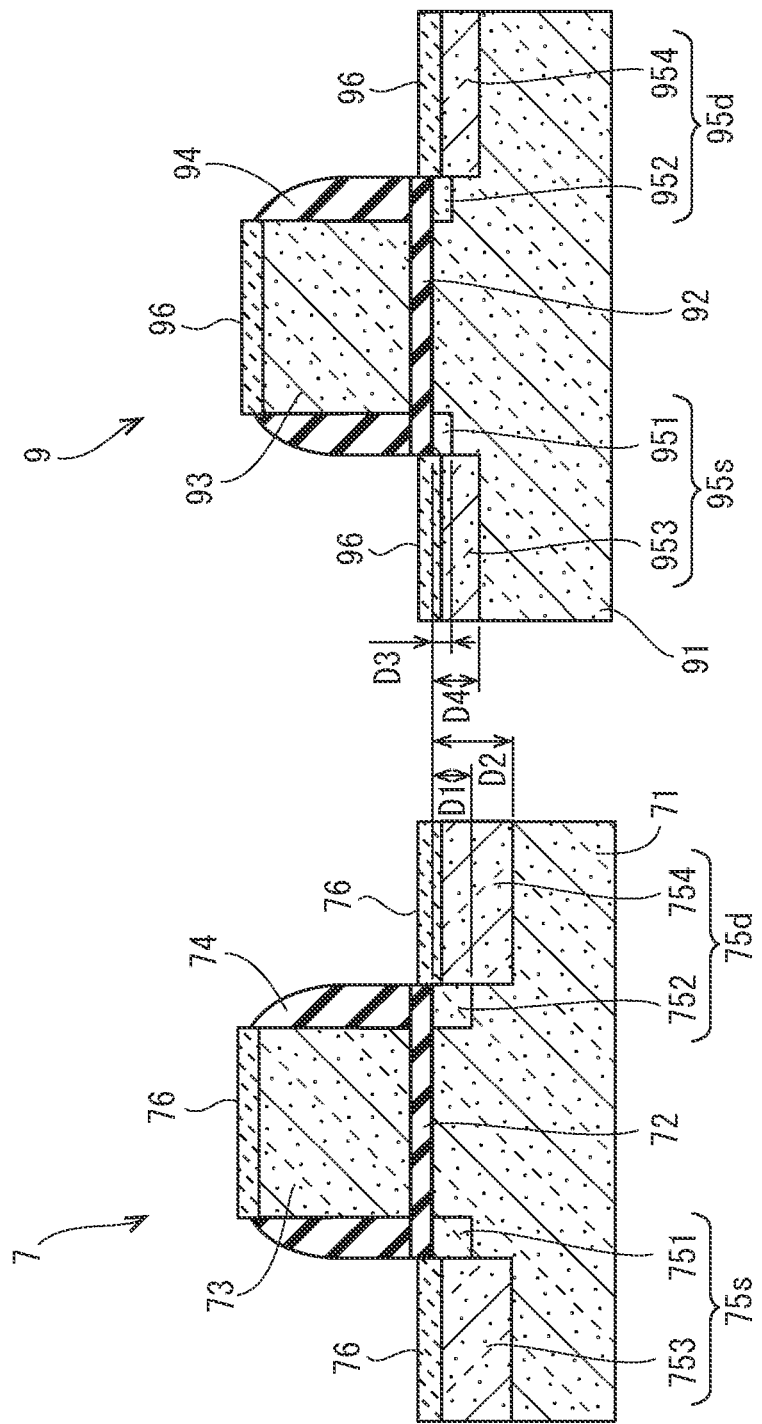
FIG. 2 is a diagram descriptive of the semiconductor device 1 according to the first embodiment of the present invention and a cross-sectional view illustrative of a digital circuit N-type MOS transistor 7 and an analog circuit N-type MOS transistor 9 in an enlarged manner.

As illustrated in FIG. 2, the depth of the extension region 752 and the depth of the deep drain region 754 of the drain region 75d, which is formed in the digital circuit N-type MOS transistor 7, are denoted by D1 and D2, respectively. The extension region 751 of the source region 75s has the same depth as the extension region 752, and the deep source region 753 of the source region 75s has the same depth as the deep drain region 754. In addition, the depth of the extension region 951 and the depth of the deep source region 953 of the source region 95s, which is formed in the analog circuit N-type MOS transistor 9, are denoted by D3 and D4, respectively. The extension region 952 of the drain region

95d has the same depth as the extension region 951, and the deep drain region 954 of the drain region 95d has the same depth as the deep source region 953. In the above, the respective depths are distances in the direction toward the interior of the semiconductor substrate 3 with reference to the surface of the semiconductor substrate 3. In addition, the respective depths are, for example, mean depths from the surface of the semiconductor substrate 3.

As illustrated in FIG. 2, in the digital circuit N-type MOS transistor 7 and the analog circuit N-type MOS transistor 9, the source region 75s and drain region 75d and the source region 95s and drain region 95d are formed in such a way that the relations "D1>D3" and "D2>D4" hold. In this way, by making the depth of the source region 95s and the drain region 95d of the analog circuit N-type MOS transistor 9 shallower than the depth of the source region 75s and the drain region 75d of the digital circuit N-type MOS transistor 7, the semiconductor device 1 is configured to have a relatively low boron concentration around an end portion of the source region 95s and an end portion of the drain region 95d in the well layer 91. This configuration enables the semiconductor device 1 to suppress TED in the analog circuit N-type MOS transistor 9.

(Manufacturing Method of Semiconductor Device)

Next, a manufacturing method of the semiconductor device according to the present embodiment will be described, while referring to FIGS. 1 and 2, using FIGS. 3 to 15. Although, in the present embodiment, a plurality of semiconductor devices are formed in plurality on one semiconductor wafer simultaneously, cross-sectional views illustrating manufacturing process with regard to a pair of a digital circuit N-type MOS transistor and an analog circuit N-type MOS transistor out of the plurality of semiconductor devices will be illustrated in FIGS. 3 to 15. In addition, in FIGS. 3 to 15, hatching is given only to newly formed components (for example, a gate electrode and a resist pattern) and the like to facilitate understanding.

Figure 3:
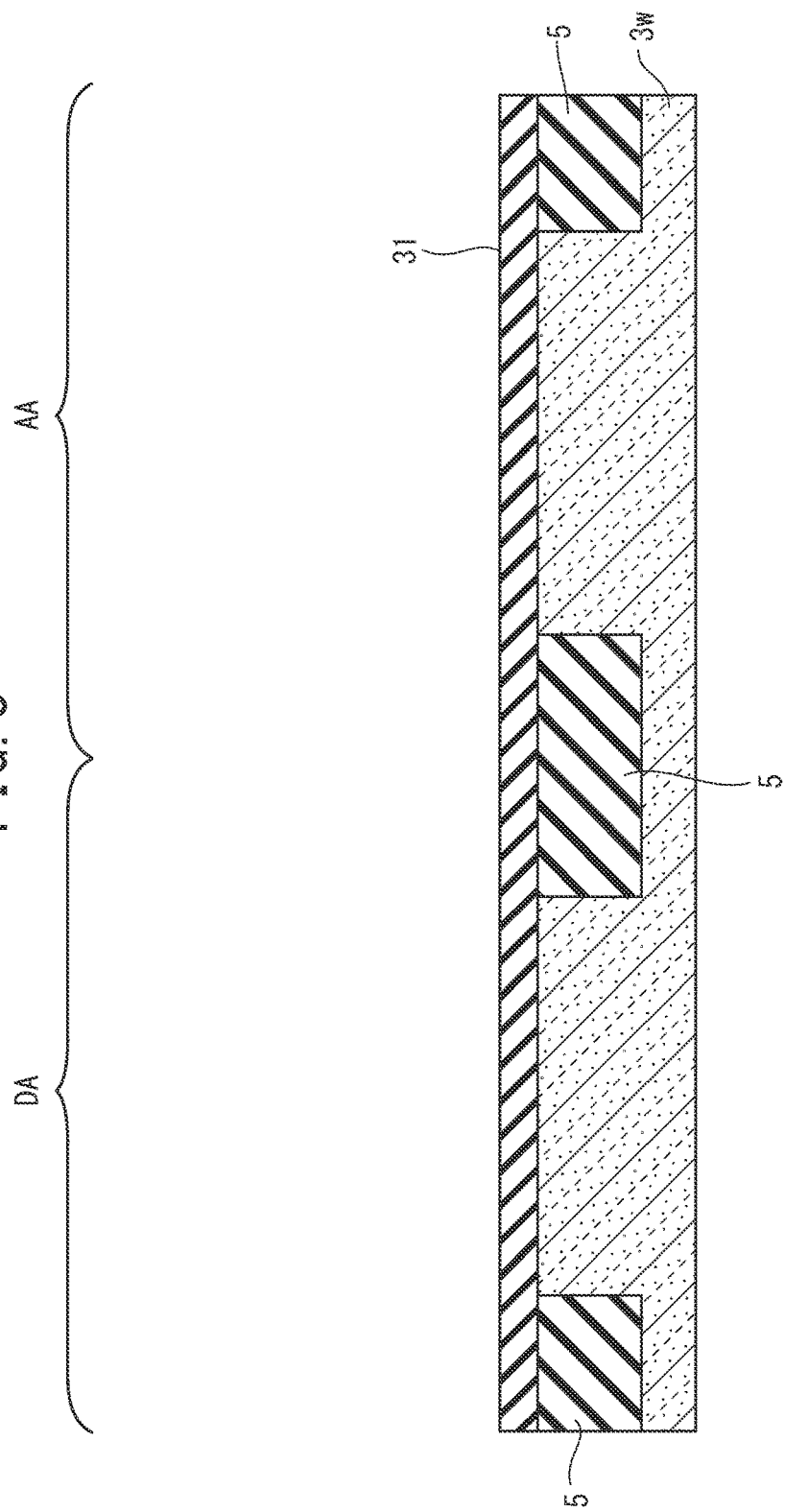
FIG. 3 is a cross-sectional view illustrating manufacturing process descriptive of a manufacturing method of the semiconductor device according to the first embodiment of the present invention and a diagram descriptive of an element separation layer forming step.

First, a semiconductor wafer 3w, which is formed of, for example, silicon, is prepared. Next, as illustrated in FIG. 3, after the semiconductor wafer 3w has been element-separated by forming a plurality of element separation layers 5 on the semiconductor wafer 3w (an example of an element separation layer forming step), a through film for channel ion implantation is formed (through film forming step). Specifically, in the through film forming step, the semiconductor wafer 3w is thermally oxidized to forma silicon dioxide ($SiO_2$) film, which serves as a through film 31, on the whole surface of the semiconductor wafer 3w including the element separation layers 5.

Figure 4:
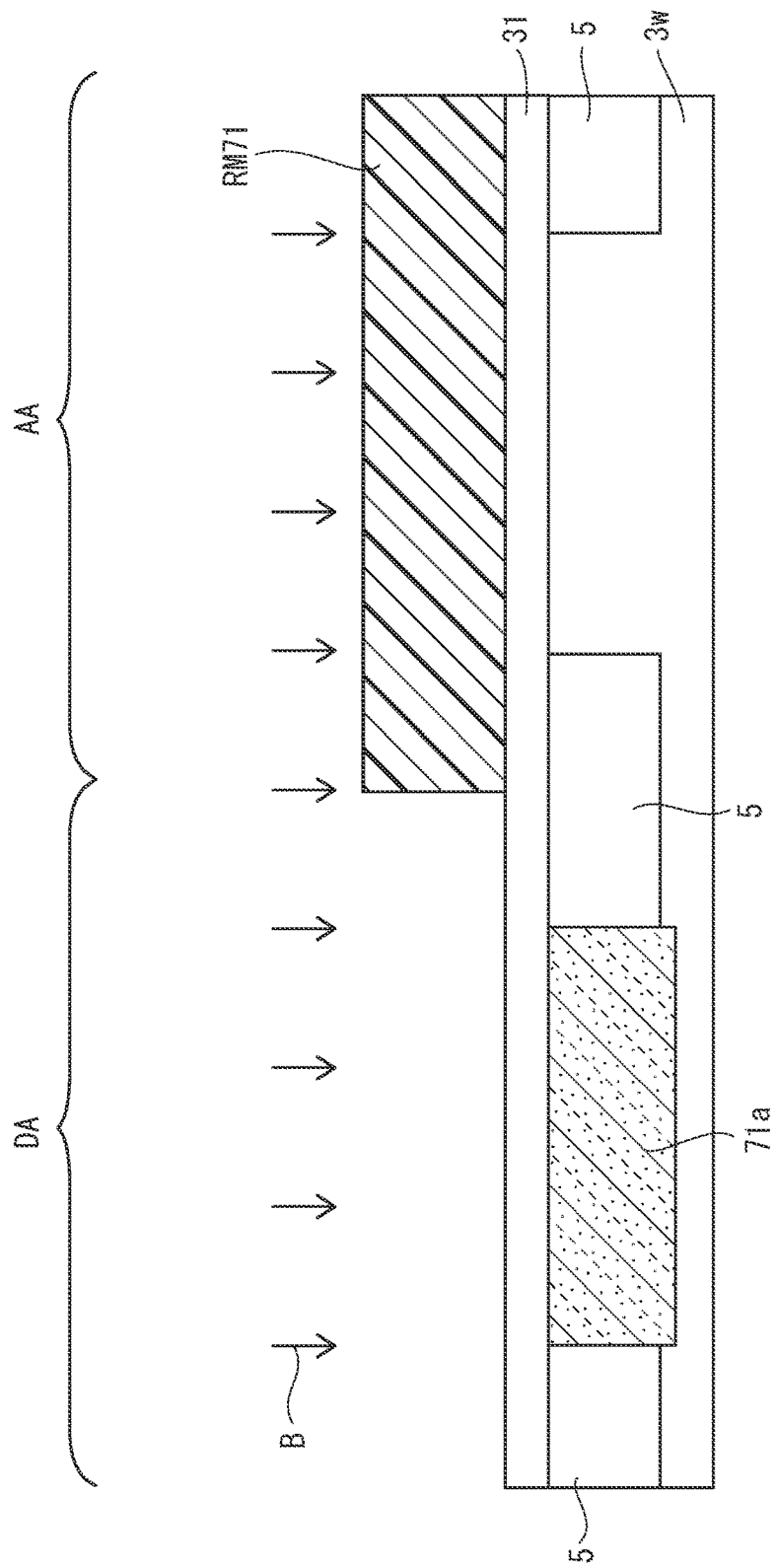
FIG. 4 is a cross-sectional view illustrating manufacturing process descriptive of the manufacturing method of the semiconductor device according to the first embodiment of the present invention and a diagram descriptive of a first well layer forming step.

Next, a channel ion implantation step (an example of a first well layer forming step) of performing ion implantation into a region in the semiconductor wafer 3w that eventually serves as a channel region of the digital circuit N-type MOS transistor 7 is performed. Specifically, in the channel ion implantation step, a resist is coated on the whole surface of the through film 31, and patterning is performed. The resist coating and patterning form a resist mask RM71 opening at a predetermined region in the digital circuit forming area DA that eventually serves as a channel region of the digital circuit N-type MOS transistor 7, as illustrated in FIG. 4. Next, using the resist mask RM71 as a mask, for example, boron (B), as impurities of a first conductivity type, is ion implanted into the semiconductor wafer 3w. The ion implantation forms a first impurity layer 71a.

Figure 5:
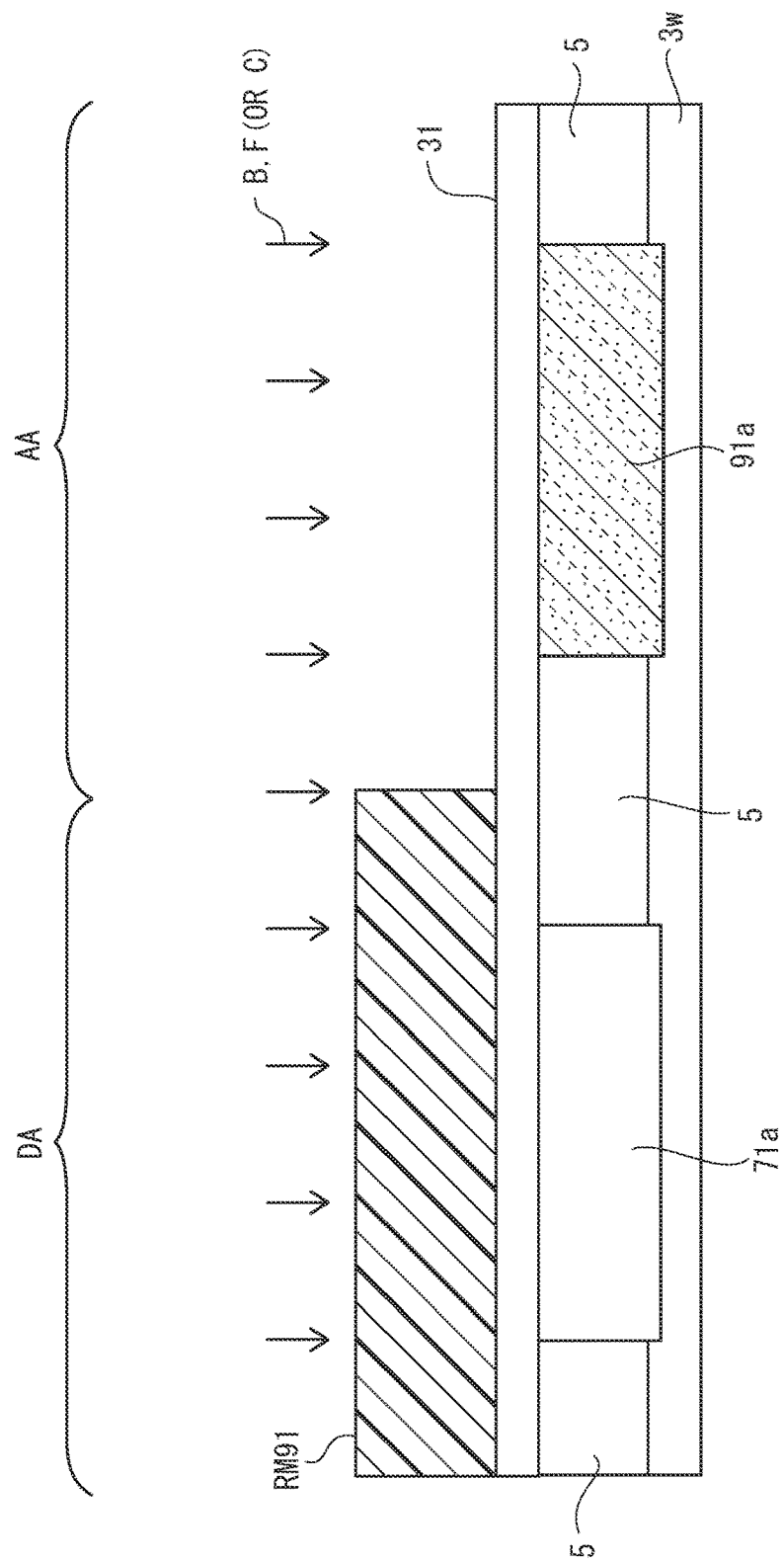
FIG. 5 is a cross-sectional view illustrating manufacturing process descriptive of the manufacturing method of the semiconductor device according to the first embodiment of the present invention and a diagram descriptive of a second well layer forming step.

Next, a channel ion implantation step (an example of a second well layer forming step) of performing ion implantation and a step of performing co-implantation into a region in the semiconductor wafer 3w that eventually serves as a channel region of the analog circuit N-type MOS transistor 9 are performed. Specifically, in the channel ion implantation step and co-implantation step, a resist is coated on the whole surface of the through film 31, and patterning is performed. The resist coating and patterning form a resist mask RM91 opening at a predetermined region in the analog circuit forming area AA that eventually serves as a channel region of the analog circuit N-type MOS transistor 9, as illustrated in FIG. 5. Next, using the resist mask RM91 as a mask, for example, boron (B), as impurities of the first conductivity type, is ion implanted into the semiconductor wafer 3w. In addition, fluorine (F) or carbon (C) is co-implanted in conjunction with boron. The ion implantation and co-implantation forma second impurity layer 91a. Note that either the ion implantation step illustrated in FIG. 4, or the channel ion implantation step and co-implantation step illustrated in FIG. 5 may be performed first.

Next, the first impurity layer 71a and the second impurity layer 91a are activated to include channel regions (channel activation). The channel activation forms the well layer 71 and the well layer 91 in the formation regions of the first impurity layer 71a and the second impurity layer 91a, respectively. In the present embodiment, an example of a first well layer forming step and an example of a second well layer forming step may be considered to be including the channel activation step.

Next, after the through film 31 has been removed, an insulating film 12 the portions of which eventually serve as gate insulating films is formed on the whole of the surface of the semiconductor wafer 3w (an example of a gate insulating film forming step).

Figure 6:
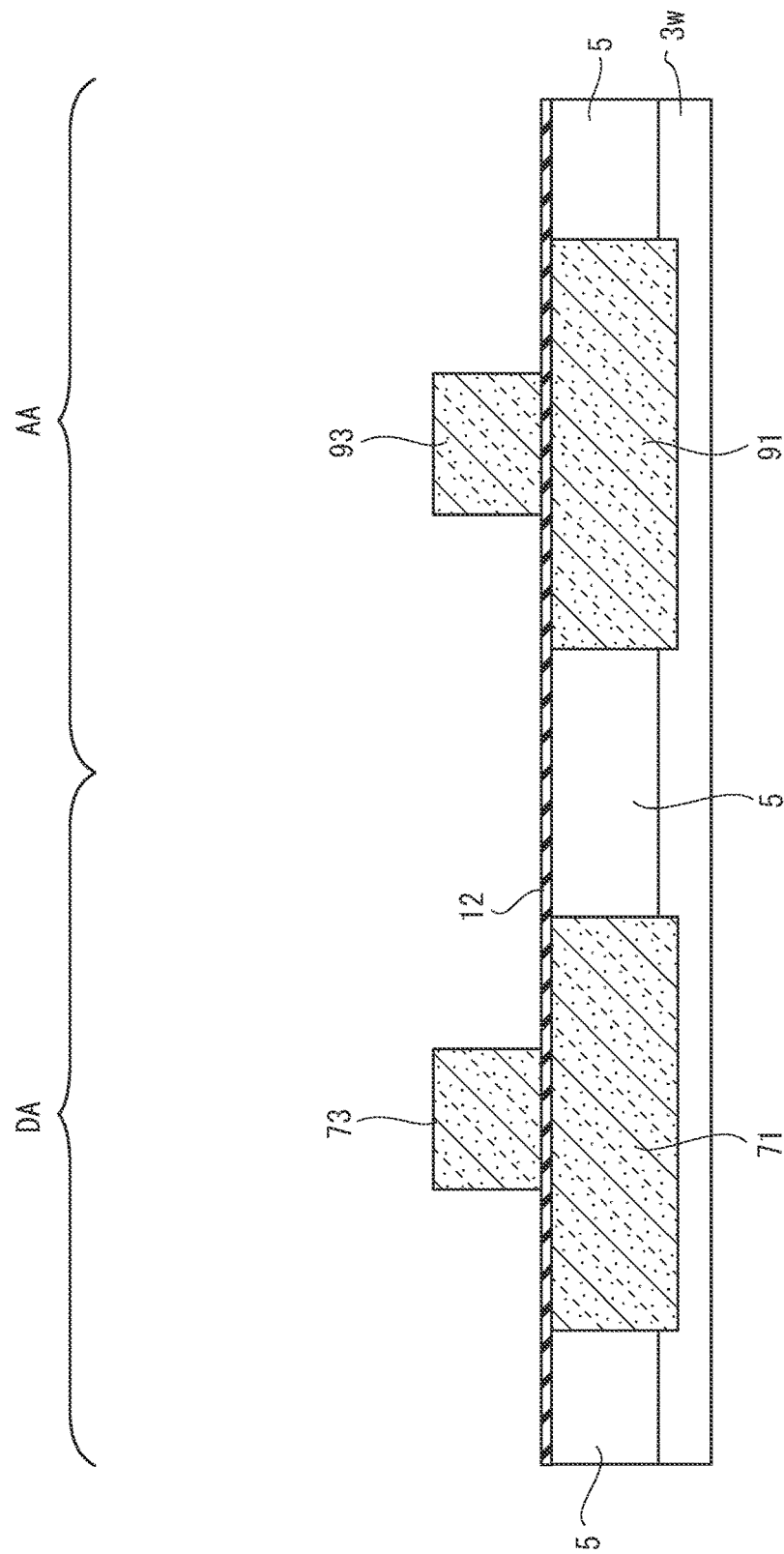
FIG. 6 is a cross-sectional view illustrating manufacturing process descriptive of the manufacturing method of the semiconductor device according to the first embodiment of the present invention and a diagram descriptive of a gate insulating film forming step and a gate electrode forming step.

Next, for example, a polysilicon film is formed on the whole surface of the insulating film 12. Next, by coating a resist on the whole surface of the polysilicon film and performing patterning, resist masks that are resists left unremoved on the formation regions of the gate electrodes 73 and 93 are formed. Next, the polysilicon film is etched using the resist masks as masks, and the resist masks are subsequently removed. The above steps form the gate electrodes 73 and 93 on the insulating film 12, as illustrated in FIG. 6 (an example of a gate electrode forming step). Subsequently, re-oxidation is performed on the semiconductor wafer 3w.

Figure 7:
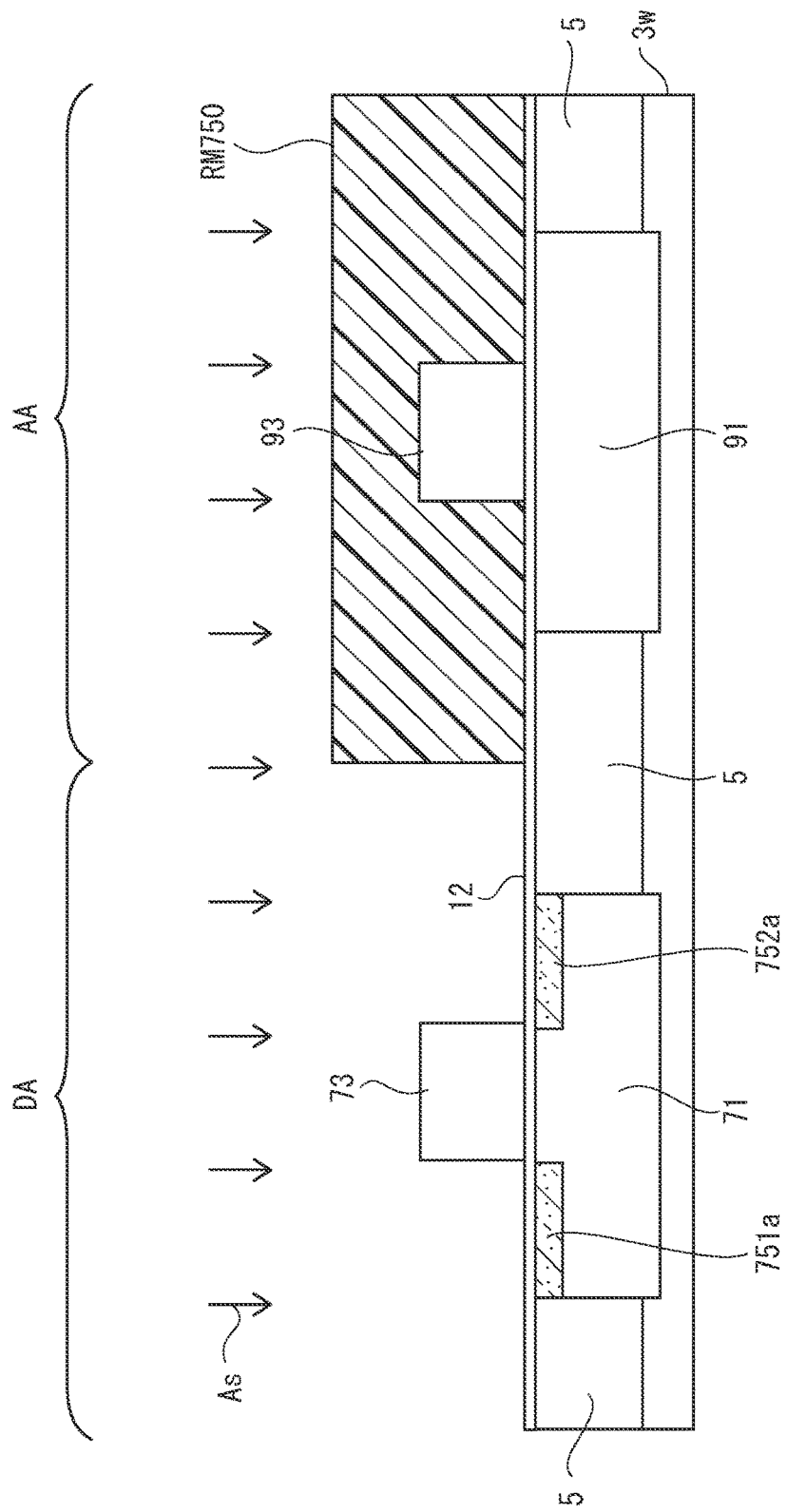
FIG. 7 is a cross-sectional view illustrating manufacturing process descriptive of the manufacturing method of the semiconductor device according to the first embodiment of the present invention and a diagram descriptive of a digital side second conductivity type impurity layer forming step.

Next, an extension implantation step (an example of a digital side second conductivity type impurity layer forming step) of performing ion implantation into regions in the semiconductor wafer 3w that eventually serve as the extension regions 751 and 752 of the digital circuit N-type MOS transistor 7 is performed. Specifically, in the extension implantation step, a resist is coated on the whole surface of the insulating film 12 including the gate electrodes 73 and 93, and patterning is performed. The resist coating and patterning form a resist mask RM750 opening at at least predetermined regions in the digital circuit forming area DA that eventually serve as the source region 75s and the drain region 75d of the digital circuit N-type MOS transistor 7, as illustrated in FIG. 7. Next, by ion implanting, for example, arsenic (As) as impurities of a second conductivity type into the semiconductor wafer 3w using the resist mask RM750 as a mask, the extension implantation is performed. The ion implantation forms second conductivity type impurity layers (an example of a digital side second conductivity type impurity layer) 751a and 752a in the well layer 71 on both sides of the gate electrode 73.

Figure 8:
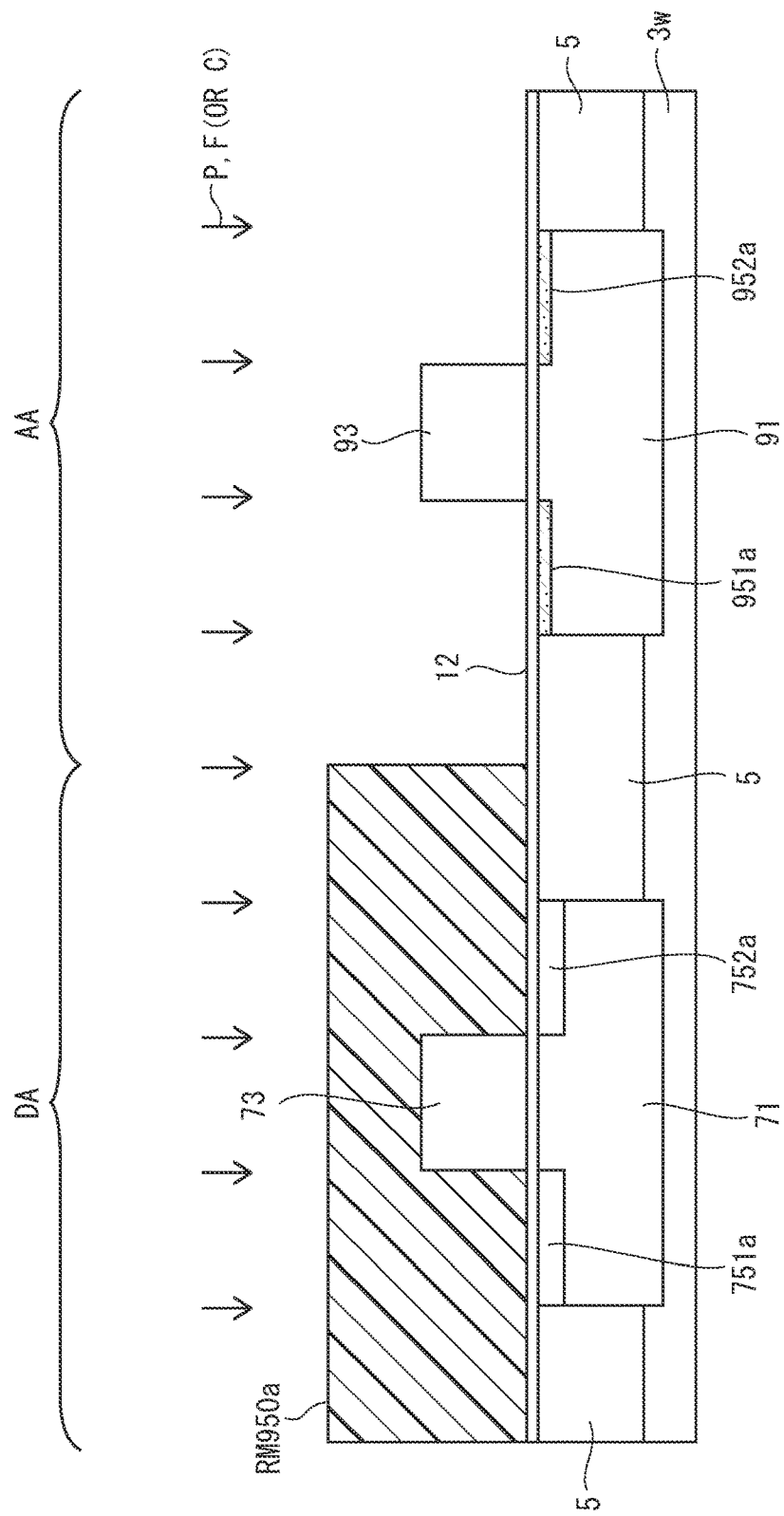
FIG. 8 is a cross-sectional view illustrating manufacturing process descriptive of the manufacturing method of the semiconductor device according to the first embodiment of the present invention and a diagram descriptive of an analog side second conductivity type impurity layer forming step (part 1)

Next, an extension implantation step (an example of an analog side second conductivity type impurity layer forming step) of performing ion implantation and a step of performing co-implantation into regions in the semiconductor wafer 3w that eventually serve as the extension regions 951 and 952 of the analog circuit N-type MOS transistor 9 are performed. Specifically, in the extension implantation step and co-implantation step, a resist is coated on the whole surface of the insulating film 12 including the gate electrodes 73 and 93, and patterning is performed. The resist coating and patterning form a resist mask RM950a opening at at least predetermined regions in the analog circuit forming area AA that eventually serve as the source region 95s and the drain region 95d of the analog circuit N-type MOS transistor 9, as illustrated in FIG. 8. Next, using the resist mask RM950a as a mask, extension implantation of, for example, phosphorus (P), as impurities of the second conductivity type, into the semiconductor wafer 3w is performed, and fluorine (F) or carbon (C) is co-implanted in conjunction with phosphorus. The extension implantation and the co-implantation form second conductivity type impurity layers (an example of an analog side second conductivity type impurity layer) 951a and 952a in the well layer 91 on both sides of the gate electrode 93.

In the extension implantation step and co-implantation step for forming the second conductivity type impurity layers 951a and 952a, the implantation amount of impurities of the second conductivity type is set smaller than that in the extension implantation step for forming the second conductivity type impurity layers 751a and 752a. As a result, the depth of the second conductivity type impurity layers 951a and 952a from the surface of the semiconductor wafer 3w is shallower than that of the second conductivity type impurity layers 751a and 752a, as illustrated in FIG. 8.

In addition, the second conductivity type impurity layers 951a and 952a may be formed separately instead of being formed simultaneously as described above using FIG. 8. In other words, in place of the extension implantation step described above with reference to FIG. 8, both a source side extension implantation step illustrated in FIG. 9 and a drain side extension implantation step illustrated in FIG. 10, both of which will be described below, may be performed. In this case, the implantation amount and depth of impurities of the second conductivity type and whether or not the co-implantation is performed with regard to the respective ones of the source region 95s and the drain region 95d may be adjusted for the purpose of, for example, suppressing TED only for the source side, where the influence of noise is large.

Figure 9:
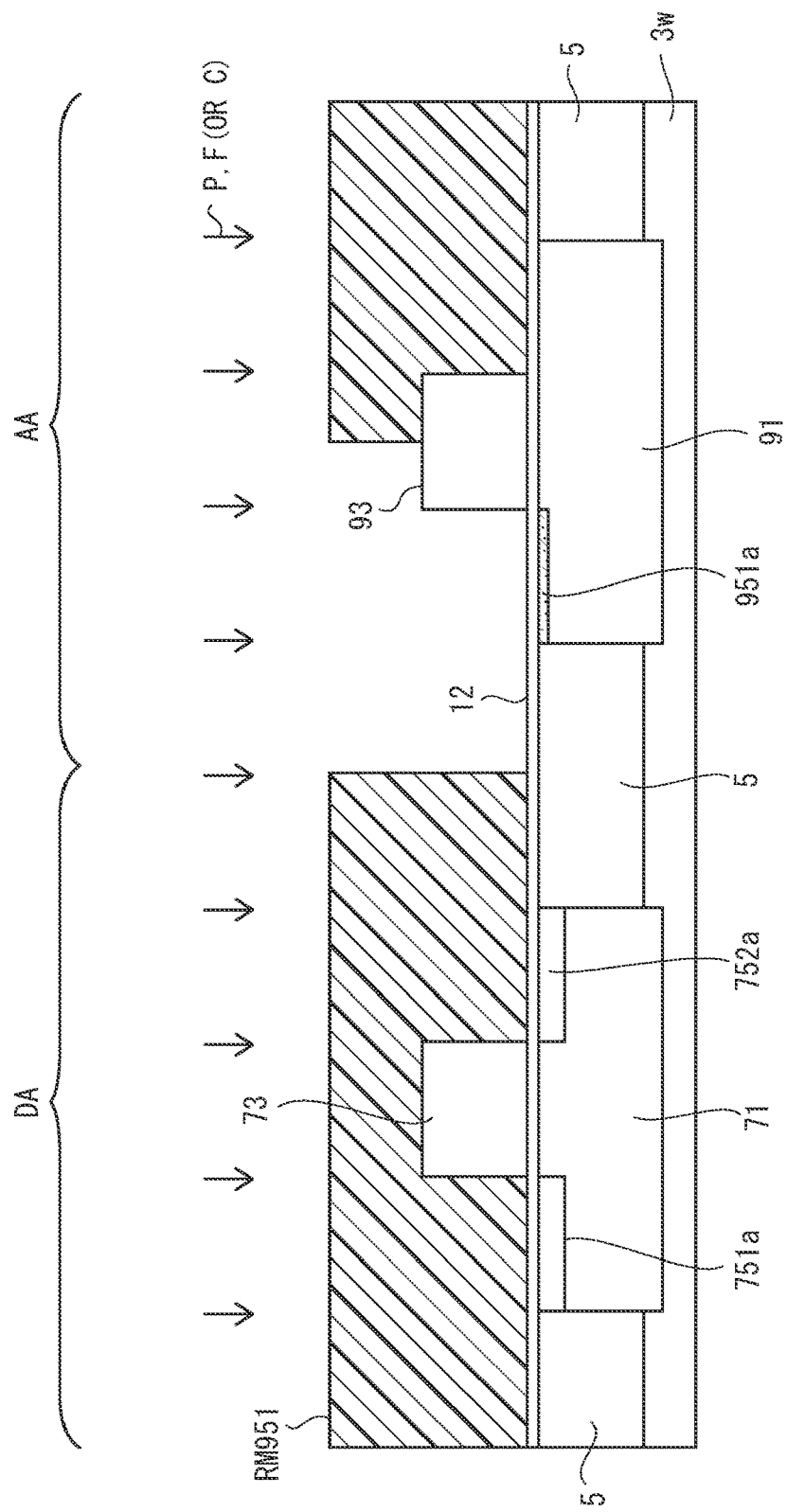
FIG. 9 is a cross-sectional view illustrating manufacturing process descriptive of the manufacturing method of the semiconductor device according to the first embodiment of the present invention and a diagram descriptive of the analog side second conductivity type impurity layer forming step (part 2)

For example, a source side extension implantation step (an example of the analog side second conductivity type impurity layer forming step) of performing ion implantation and a step of performing co-implantation into a region in the semiconductor wafer 3w that eventually serves as the extension region 951 in the source region 95s of the analog circuit N-type MOS transistor 9 are performed. Specifically, in the source side extension implantation step and co-implantation step, a resist is coated on the whole surface of the insulating film 12 including the gate electrodes 73 and 93, and patterning is performed. The resist coating and patterning form a resist mask RM951 opening at at least a predetermined region in the analog circuit forming area AA that eventually serves as the source region 95s of the analog circuit N-type MOS transistor 9, as illustrated in FIG. 9. Next, using the resist mask RM951 as a mask, extension implantation is performed by ion implanting, for example, phosphorus (P) as impurities of the second conductivity type into the semiconductor wafer 3w, and fluorine (F) or carbon (C) is co-implanted in conjunction with phosphorus. On this occasion, in the source side extension implantation step, the implantation amount of impurities is set smaller and the implantation depth of impurities is set shallower than those in a drain side extension implantation step. The extension implantation and the co-implantation form the second conductivity type impurity layer 951a in the well layer 91 on one of both sides of the gate electrode 93.

Figure 10:
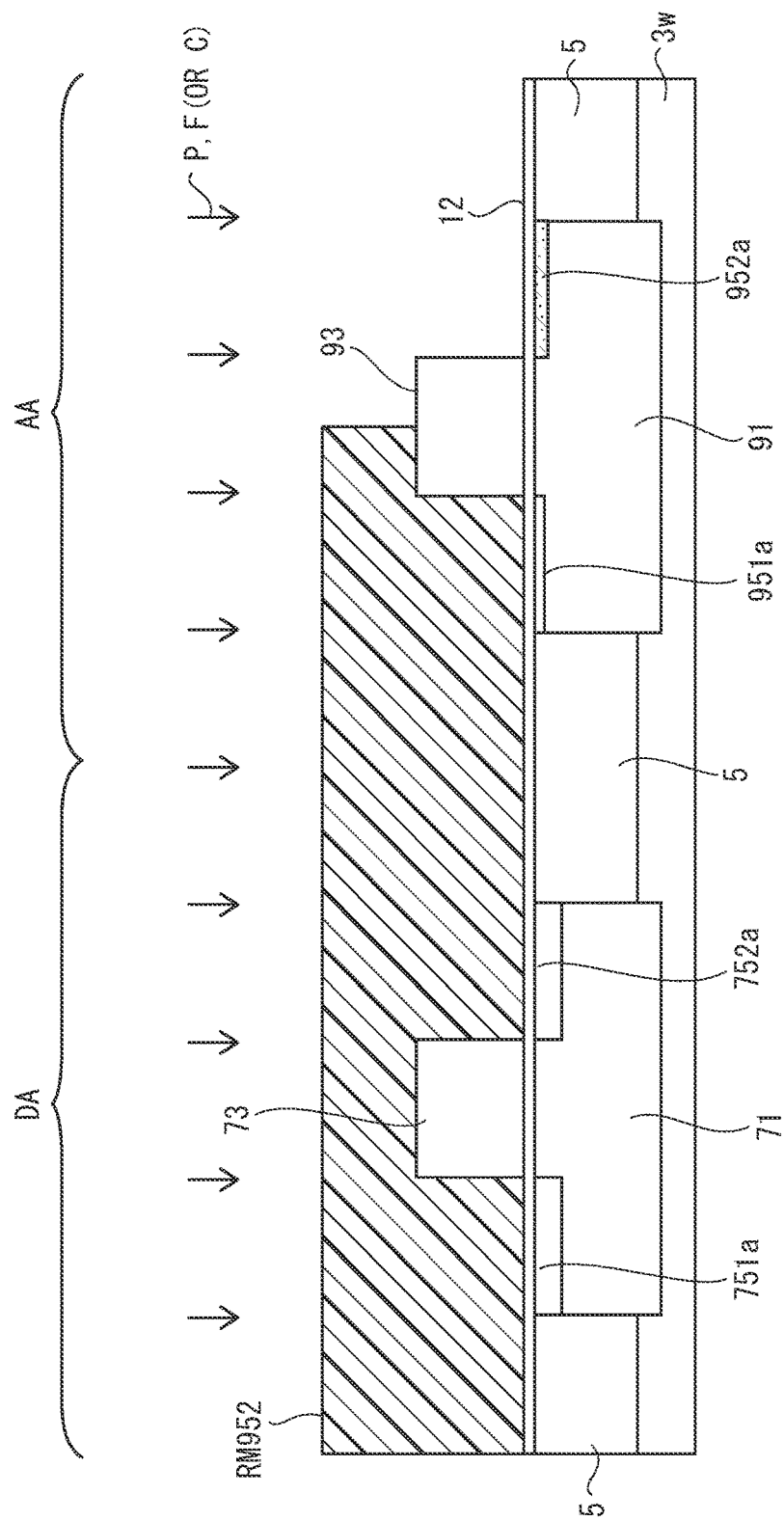
FIG. 10 is a cross-sectional view illustrating manufacturing process descriptive of the manufacturing method of the semiconductor device according to the first embodiment of the present invention and a diagram descriptive of the analog side second conductivity type impurity layer forming step (part 3)

Next, the drain side extension implantation step (an example of the analog side second conductivity type impurity layer forming step) of performing ion implantation and a step of performing co-implantation into a region in the semiconductor wafer 3w that eventually serves as the extension region 952 in the drain region 95d of the analog circuit N-type MOS transistor 9 are performed. In the drain side extension implantation step and co-implantation step, a resist is coated on the whole surface of the insulating film 12 including the gate electrodes 73 and 93, and patterning is performed. The resist coating and patterning form a resist mask RM952 opening at at least a predetermined region in the analog circuit forming area AA that eventually serves as the drain region 95d of the analog circuit N-type MOS transistor 9, as illustrated in FIG. 10. Next, using the resist mask RM952 as a mask, extension implantation is performed by ion implanting, for example, phosphorus (P) as impurities of the second conductivity type into the semiconductor wafer 3w, and fluorine (F) or carbon (C) is co-implanted in conjunction with phosphorus. The extension implantation and the co-implantation form the second conductivity type impurity layer 952a in the well layer 91 on the other of both sides of the gate electrode 93. Note that either the source side extension implantation step and co-implantation step illustrated in FIG. 9, or the drain side extension implantation step and co-implantation step illustrated in FIG. 10 may be performed first. In addition, there is a case where the co-implantation of fluorine (F) or carbon (C) causes the diffusion of impurities implanted in the drain side extension implantation step to be suppressed. For this reason, it is preferable that the co-implantation of fluorine (F) or carbon (C) is not performed when the second conductivity type impurity layer 952a is formed and the co-implantation of fluorine (F) or carbon (C) is performed only when the second conductivity type impurity layer 951a is formed.

Next, by performing activation annealing on the semiconductor wafer 3w, the second conductivity type impurity layers 751a and 752a and the second conductivity type impurity layers 951a and 952a are activated. The activation annealing forms the extension regions 751 and 752 and the extension regions 951 and 952 in the formation regions of the second conductivity type impurity layers 751a and 752a and the formation regions of the second conductivity type impurity layers 951a and 952a, respectively. In the present embodiment, an example of the digital side second conductivity type impurity layer forming step and an example of the analog side second conductivity type impurity layer forming step may be considered to be including the activation annealing step.

Figure 11:
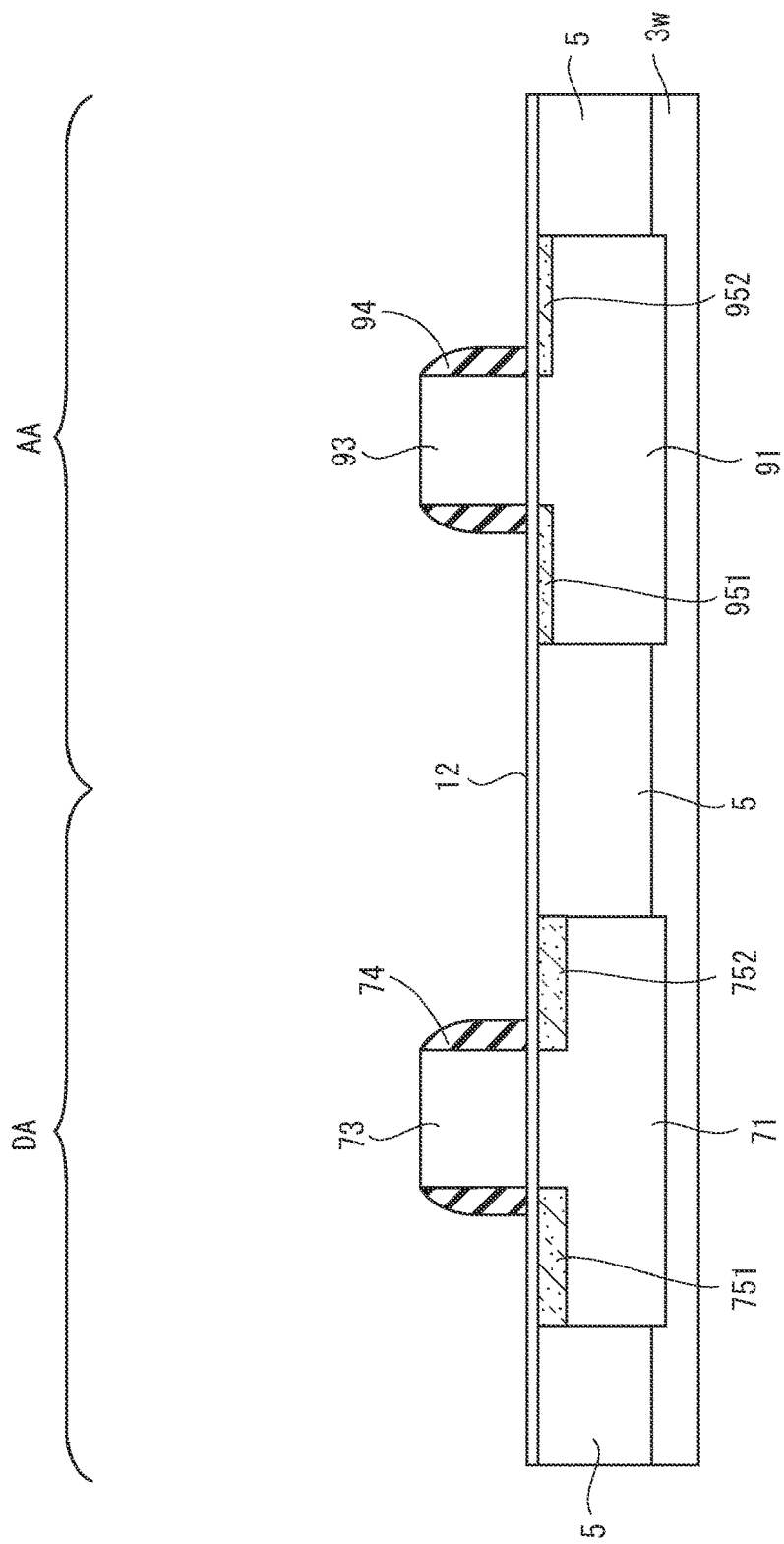
FIG. 11 is a cross-sectional view illustrating manufacturing process descriptive of the manufacturing method of the semiconductor device according to the first embodiment of the present invention and a diagram descriptive of a sidewall forming step.

Next, as illustrated in FIG. 11, a step (sidewall forming step) of forming the sidewalls 74 and 94 made of an insulating film on the respective side surfaces of the gate electrodes 73 and 93 is performed. The sidewalls 74 and 94 are formed by depositing an insulating film using a chemical vapor deposition (CVD) method and performing anisotropic etching.

Figure 12:
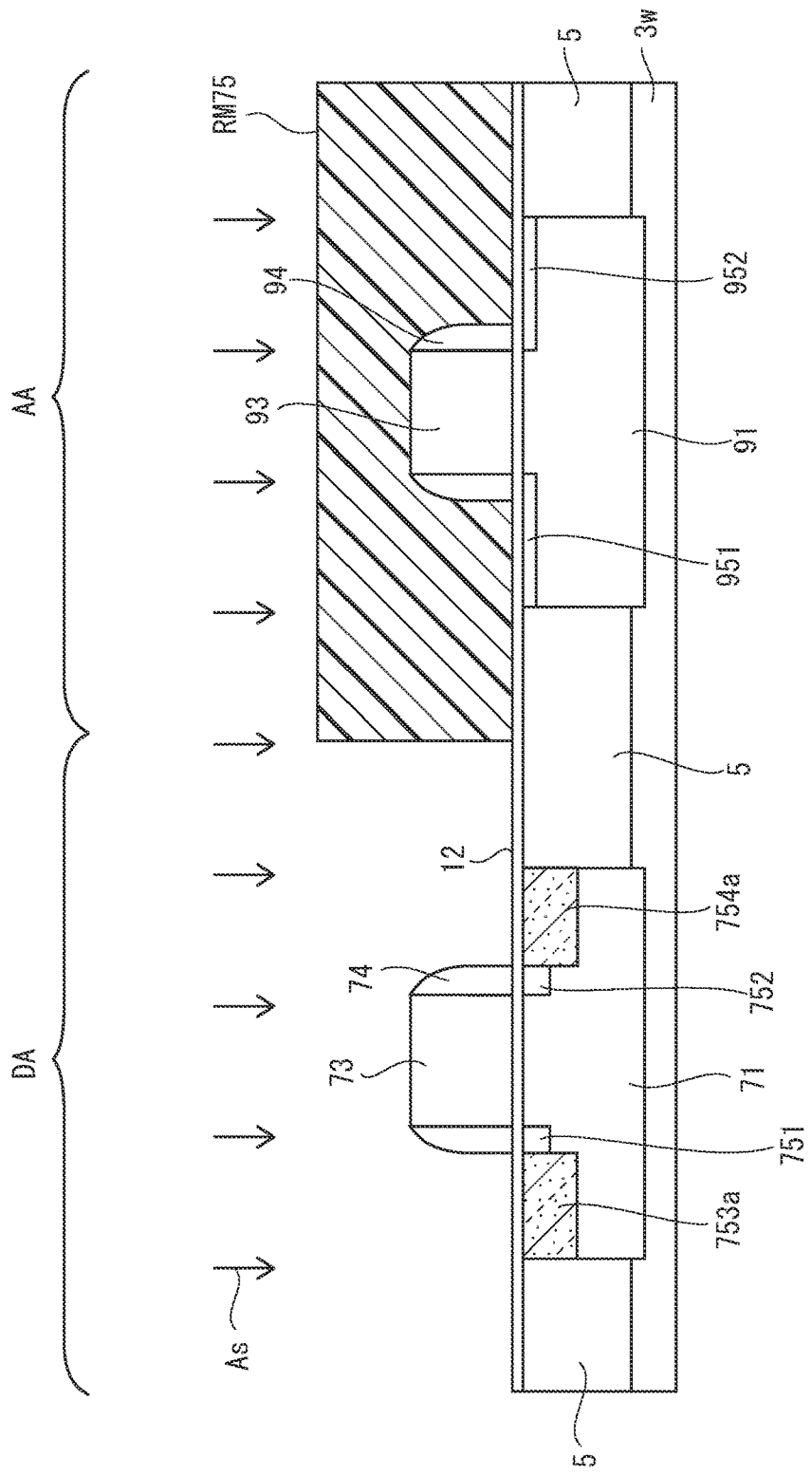
FIG. 12 is a cross-sectional view illustrating manufacturing process descriptive of the manufacturing method of the semiconductor device according to the first embodiment of the present invention and a diagram descriptive of a first source/drain forming step.

Next, a step (an example of a first source/drain forming step) of performing deep source/drain implantation into a region that include at least regions in which the deep source region 753 and the deep drain region 754 of the digital circuit N-type MOS transistor 7 are eventually formed is performed. Specifically, in the deep source/drain implantation step, a resist is coated on the whole surface of the insulating film 12 including the gate electrodes 73 and 93 and the sidewalls 74 and 94, and patterning is performed. The resist coating and patterning form a resist mask RM75 opening at at least predetermined regions in the digital circuit forming area DA that eventually serve as the source region 75s and the drain region 75d of the digital circuit N-type MOS transistor 7, as illustrated in FIG. 12. Next, by ion implanting, for example, arsenic (As) as impurities of the second conductivity type into the semiconductor wafer 3w using the resist mask RM75 as a mask, the deep source/drain implantation is performed. The ion implantation forms second conductivity type deep impurity layers 753a and 754a in the well layer 71 on both sides of the gate electrode 73.

Figure 13:
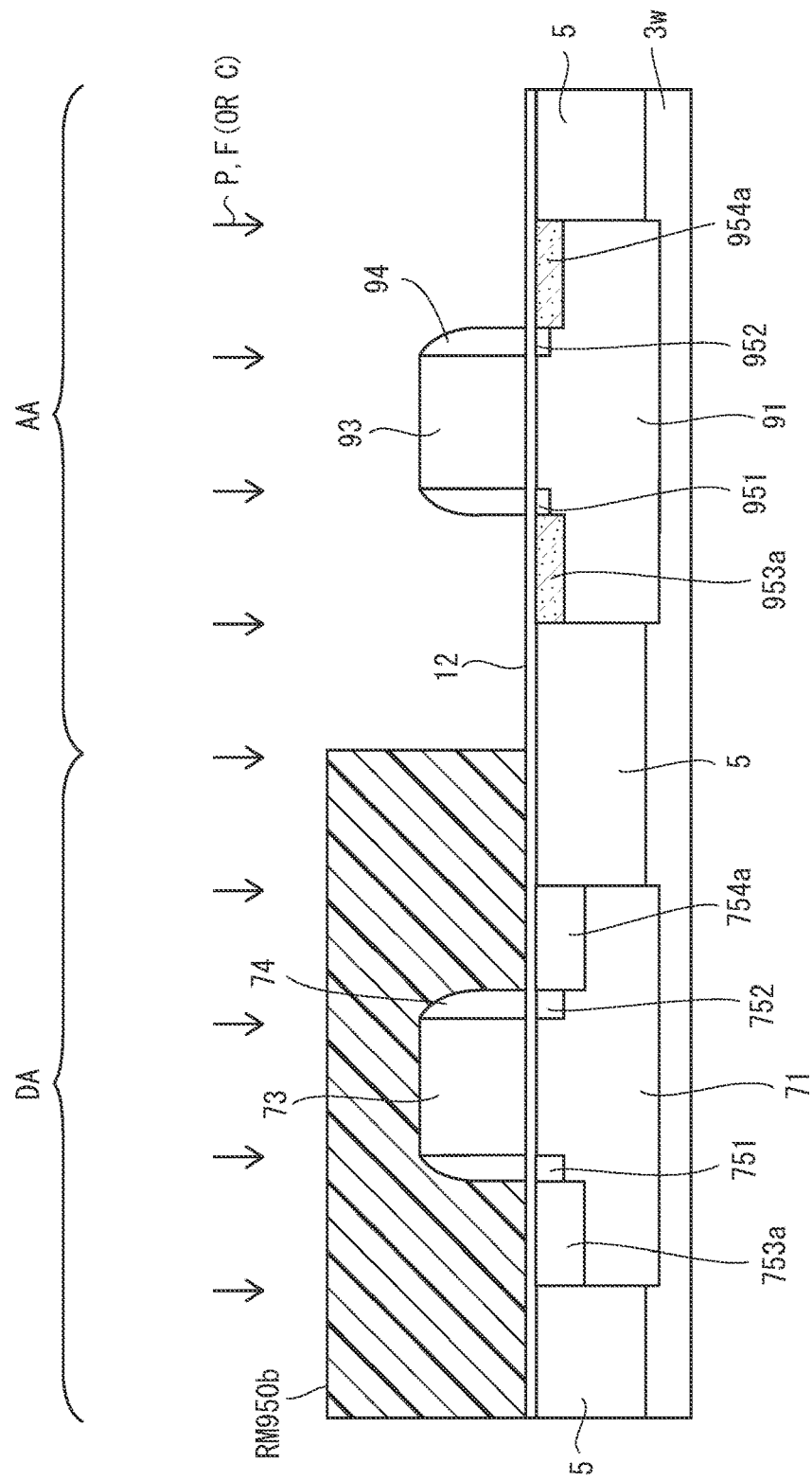
FIG. 13 is a cross-sectional view illustrating manufacturing process descriptive of the manufacturing method of the semiconductor device according to the first embodiment of the present invention and a diagram descriptive of a second source/drain forming step (part 1)

Next, a step (an example of a second source/drain forming step) of performing deep source/drain implantation and a step of performing co-implantation into a region that includes at least regions in which the deep source region 953 and the deep drain region 954 of the analog circuit N-type MOS transistor 9 are eventually formed are performed. In the deep source/drain implantation step and co-implantation step, a resist is coated on the whole surface of the insulating film 12 including the gate electrodes 73 and 93 and the sidewalls 74 and 94, and patterning is performed. The resist coating and patterning form a resist mask RM950b opening at at least predetermined regions in the analog circuit forming area AA that eventually serve as the source region 95s and the drain region 95d of the analog circuit N-type MOS transistor 9, as illustrated in FIG. 13. Next, using the resist mask RM950b as a mask, deep source implantation of, for example, phosphorus (P), as impurities of the second conductivity type, into the semiconductor wafer 3w is performed, and fluorine (F) or carbon (C) is co-implanted in conjunction with phosphorus. The deep source implantation and the co-implantation form the second conductivity type deep impurity layers 953a and 954a in the well layer 91 on both sides of the gate electrode 93.

In addition, the second conductivity type deep impurity layers 953a and 954a may be formed separately instead of being formed simultaneously as described above using FIG. 13. In other words, in place of the deep source/drain implantation step described above with reference to FIG. 13, both a deep source implantation step illustrated in FIG. 14 and a deep drain implantation step illustrated in FIG. 15, both of which will be described below, may be performed. In this case, the implantation amount and depth of impurities of the second conductivity type and whether or not the co-implantation is performed with regard to the respective ones of the source region 95s and the drain region 95d may be adjusted for the purpose of, for example, suppressing TED only for the source side, where the influence of noise is large.

Figure 14:
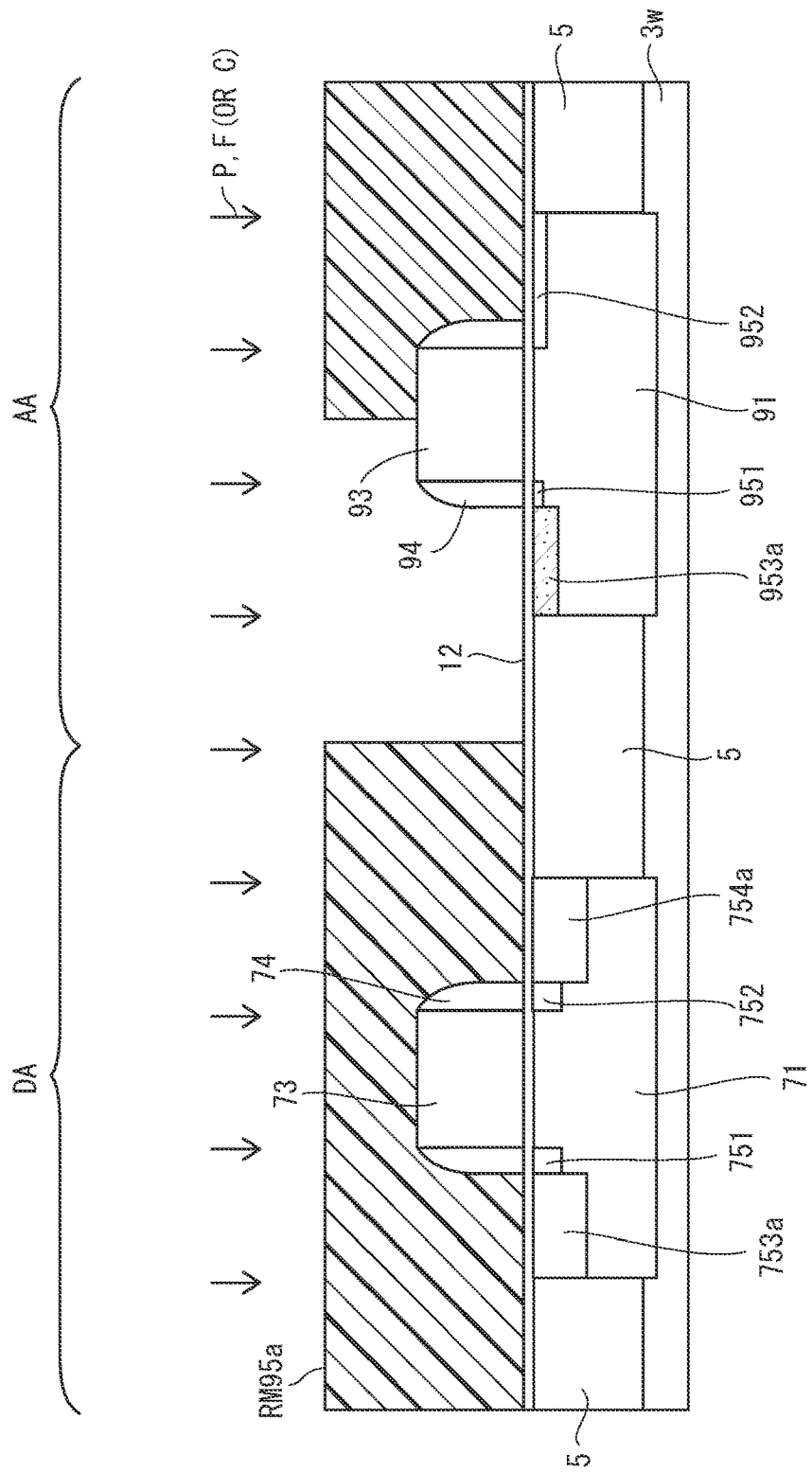
FIG. 14 is a cross-sectional view illustrating manufacturing process descriptive of the manufacturing method of the semiconductor device according to the first embodiment of the present invention and a diagram descriptive of the second source/drain forming step (part 2)

For example, a step (an example of the second source/drain forming step) of performing deep source implantation and a step of performing co-implantation into a region that includes at least a region in which the deep source region 953 in the source region 95s of the analog circuit N-type MOS transistor 9 is eventually formed are performed. In the deep source implantation step and co-implantation step, a resist is coated on the whole surface of the insulating film 12 including the gate electrodes 73 and 93 and the sidewalls 74 and 94, and patterning is performed. The resist coating and patterning form a resist mask RM95a opening at at least a predetermined region in the analog circuit forming area AA that eventually serves as the deep source region 953 of the analog circuit N-type MOS transistor 9, as illustrated in FIG. 14. Next, using the resist mask RM95a as a mask, deep source implantation of, for example, phosphorus (P), as impurities of the second conductivity type, into the semiconductor wafer 3w is performed, and fluorine (F) or carbon (C) is co-implanted in conjunction with phosphorus. On this occasion, in the deep source implantation step, the implantation amount of impurities is set smaller and the implantation depth of impurities is set shallower than those in a deep drain implantation step. The deep source implantation and the co-implantation form the second conductivity type deep impurity layer 953a in the well layer 91 on one of both sides of the gate electrode 93.

Figure 15:
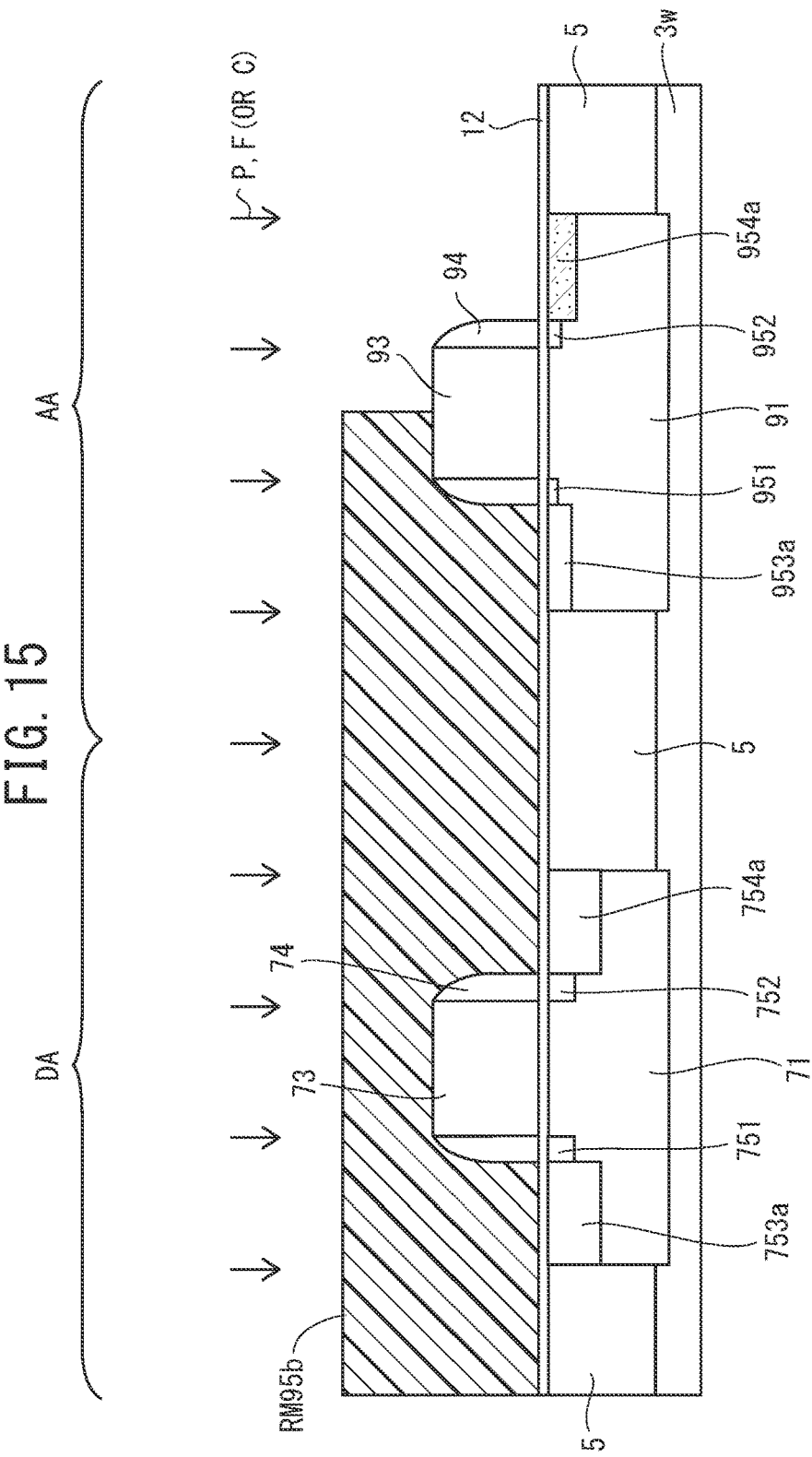
FIG. 15 is a cross-sectional view illustrating manufacturing process descriptive of the manufacturing method of the semiconductor device according to the first embodiment of the present invention and a diagram descriptive of the second source/drain forming step (part 3)

Next, a step (an example of the second source/drain forming step) of performing deep drain implantation and a step of performing co-implantation into a region that includes at least a region in which the deep drain region 954 in the drain region 95d of the analog circuit N-type MOS transistor 9 is eventually formed are performed. In the deep drain implantation step and co-implantation step, a resist is coated on the whole surface of the insulating film 12 including the gate electrodes 73 and 93 and the sidewalls 74 and 94, and patterning is performed. The resist coating and patterning form a resist mask RM95b opening at at least a predetermined region in the analog circuit forming area AA that eventually serves as the deep drain region 954 of the analog circuit N-type MOS transistor 9, as illustrated in FIG. 15. Next, using the resist mask RM95b as a mask, deep drain implantation of, for example, phosphorus (P), as impurities of the second conductivity type, into the semiconductor wafer 3w is performed, and fluorine (F) or carbon (C) is co-implanted in conjunction with phosphorus. The deep drain implantation and the co-implantation form the second conductivity type deep impurity layer 954a in the well layer 91 on the other of both sides of the gate electrode 93. Note that either the deep source implantation step and co-implantation step illustrated in FIG. 14 or the deep drain implantation step and co-implantation step illustrated in FIG. 15 may be performed first. In addition, there is a case where the co-implantation of fluorine (F) or carbon (C) causes the diffusion of impurities implanted in the deep drain implantation step to be suppressed. For this reason, it is preferable that the co-implantation of fluorine (F) or carbon (C) is not performed when the second conductivity type deep impurity layer 954a is formed and the co-implantation of fluorine (F) or carbon (C) is performed only when the second conductivity type deep impurity layer 953a is formed.

In the present embodiment, in the deep source/drain implantation step and co-implantation step, the deep source implantation step and co-implantation step, and the deep drain implantation step and co-implantation step in the analog circuit forming area AA, the implantation amount of impurities of the second conductivity type is set smaller than that in the deep source/drain implantation step and co-implantation step in the digital circuit forming area DA. This causes the source region 75s and drain region 75d and the source region 95s and drain region 95d to be eventually formed in such a way that the relations "D1>D3" and "D2>D4" hold, as illustrated in FIG. 2.

Either the deep source implantation step and co-implantation step or the deep drain implantation step and co-implantation step may be performed first. In addition, either the deep source/drain implantation step in the digital circuit forming area DA or the deep source/drain implantation step and co-implantation step, the deep source implantation step and co-implantation step, and the deep drain implantation step and co-implantation step in the analog circuit forming area AA may be performed first.

Next, by performing activation annealing on the semiconductor wafer 3w, the second conductivity type deep impurity layers 753a and 754a and the second conductivity type deep impurity layers 953a and 954a are activated. The activation annealing forms the deep source region 753 and the deep drain region 754 in the formation regions of the second conductivity type deep impurity layers 753a and 754a, respectively. The activation annealing also forms the deep source region 953 and the deep drain region 954 in the formation regions of the second conductivity type deep impurity layers 953a and 954a, respectively. As a result, the source region 75s including the extension region 751 and the deep source region 753 and the drain region 75d including the extension region 752 and the deep drain region 754 are formed in the well layer 71 on both sides of the gate electrode 73, as illustrated in FIG. 1. In addition, the source region 95s including the extension region 951 and the deep source region 953 and the drain region 95d including the extension region 952 and the deep drain region 954 are formed in the well layer 91 on both sides of the gate electrode 93. In the present embodiment, an example of the first source/drain forming step and an example of the second source/drain forming step may be considered to be including the activation annealing step.

Next, using the gate electrode 73 and sidewall 74 and the gate electrode 93 and sidewall 94 as masks, the insulating film 12 is etched. The etching forms the gate insulating film 72 below the gate electrode 73 and sidewall 74 and the gate insulating film 92 below the gate electrode 93 and sidewall 94, as illustrated in FIG. 1.

Next, a step (silicide film forming step) of forming silicide films on the surfaces of the source region 75s, the drain region 75d, and the gate electrode 73 and the source region 95s, the drain region 95d, and the gate electrode 93 is performed. In the silicide film forming step, a metal film is formed on the whole surface of the semiconductor wafer 3w including the source region 75s, the drain region 75d, and the gate electrode 73 and the source region 95s, the drain region 95d, and the gate electrode 93, and annealing treatment is performed on the metal film. The annealing treatment causes the surfaces of the source region 75s, the drain region 75d, and the gate electrode 73 and the source region 95s, the drain region 95d, and the gate electrode 93 and the metal film to react with each other and silicides to be formed. Subsequently, unnecessary metal films are removed by chemical solution treatment. As a result, the silicide films 76 are formed on the source region 75s, the drain region 75d, and the gate electrode 73, and the silicide films 96 are formed on the source region 95s, the drain region 95d, and the gate electrode 93, as illustrated in FIG. 1.

In this way, the digital circuit N-type MOS transistor 7 and the analog circuit N-type MOS transistor 9 are formed in the digital circuit forming area DA and the analog circuit forming area AA, respectively.

Although illustration is omitted, subsequently, a protective layer is formed on the whole surface of the semiconductor wafer 3w including the digital circuit N-type MOS transistor 7 and the analog circuit N-type MOS transistor 9. Next, contact holes are formed in predetermined regions of the protective layer, and, in the contact holes, electrode plugs electrically connected to the source region 75s, the drain region 75d, and the gate electrode 73 and the source region 95s, the drain region 95d, and the gate electrode 93 are formed. Next, wiring connected to the electrode plugs is formed. Next, the semiconductor wafer 3w is cut at predetermined positions into individual pieces. The step completes the semiconductor device 1 including the digital circuit N-type MOS transistor 7 and the analog circuit N-type MOS transistor 9.

(Effects of Channel Ion Implantation Dedicated to Analog Circuit Forming Area)

Next, effects of channel ion implantation dedicated to the analog circuit forming area in the manufacturing method of the semiconductor device according to the present embodiment will be described using FIG. 16. The abscissa and the ordinate of a graph illustrated in FIG. 16 indicate depth (μm) in the semiconductor substrate 3 with reference to the boundary face between the semiconductor substrate and the gate oxide film (that is, the surface of the semiconductor substrate) (0 μm) and impurity concentration ($cm^{-3}$) in the channel, respectively.

As described above, in the manufacturing method of the semiconductor device according to the present embodiment, the channel ion implantation step dedicated to the analog circuit forming area AA is included in the process for forming the well layer 91 (see FIG. 5). In the present embodiment, the amount of channel dose in the analog circuit forming area AA is set smaller than that in the digital circuit forming area DA. In addition, in the forming step of the well layer 91 in the analog circuit forming area AA, impurities of the first conductivity type may be implanted so that the concentration thereof increases in the depth direction of the semiconductor substrate 3. In other words, it may be configured so that the profile of impurity concentration in the second impurity layer 91a in the analog circuit forming area AA has a retrograde distribution. In the second impurity layer 91a in the analog circuit forming area AA, the concentration of impurities of the first conductivity type at the surface of the semiconductor wafer 3w may be set lower than the concentration of impurities of the first conductivity type inside the semiconductor wafer 3w. The smaller the amount of impurities in the channel is, the harder it is for the TED of impurities of the first conductivity type to occur. Although, in the present embodiment, fluorine or carbon is co-implanted to further suppress TED when the second impurity layer 91a is formed, TED may be suppressed even without performing the co-implantation.

Figure 16:
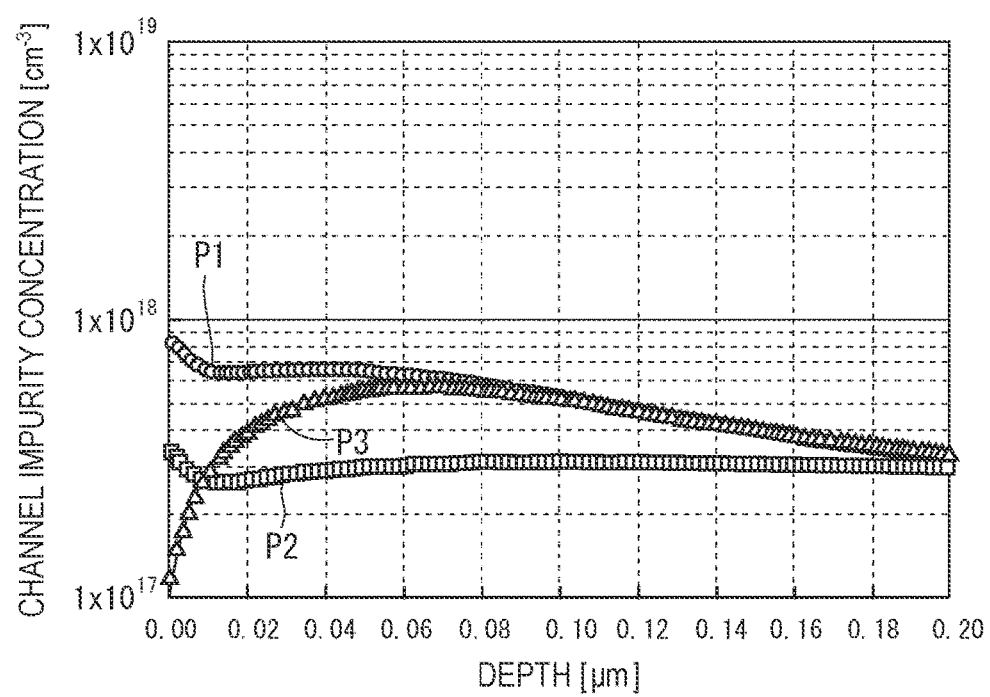
FIG. 16 is a view descriptive of the semiconductor device and a manufacturing method of the semiconductor device according to the first embodiment of the present invention and a graph illustrative of depth direction distributions of channel impurities obtained from a process simulation.

In FIG. 16, a profile P1 connecting circles, a profile P2 connecting squares, and a profile P3 connecting triangles are illustrated. The profiles P1 and P2 indicate impurity concentration distributions when boron is used as channel impurities, and the profile P3 indicates an impurity concentration distribution when indium is used as channel impurities.

As illustrated in FIG. 16, the profile P2 has lower impurity concentration than the profile P1. In other words, the profile P2 may be viewed as a profile of impurities implanted in the channel ion implantation in the analog circuit forming area AA. In addition, the profile P1 may be viewed as a profile of impurities implanted in the channel ion implantation in the digital circuit forming area DA. Setting the impurity concentration in the second impurity layer 91a in the analog circuit forming area AA lower than the impurity concentration in the first impurity layer 71a in the digital circuit forming area DA enables the amount of overlap between interstitial silicon generated in the extension ion implantation and the deep source/drain ion implantation and channel impurities to be decreased. As a result, TED in the analog circuit N-type MOS transistor 9 may be suppressed.

The profile P3 indicates a retrograde distribution. In the profile P3, the impurity concentration around the boundary face between the gate oxide film and the semiconductor substrate (silicon substrate) is reduced to lower values than the profile P2. This enables the amount of overlap between interstitial silicon generated in the extension ion implantation and channel impurities to be decreased, which enables TED in the analog circuit forming area AA to be suppressed.

(Effects of Extension Implantation)

Next, effects of the extension implantation step in the manufacturing method of the semiconductor device according to the present embodiment will be described.

As described above, in the manufacturing method of the semiconductor device according to the present embodiment, an extension step dedicated to the analog circuit forming area AA is included in the process for forming the source region 95s and the drain region 95d (see FIG. 8). In the present embodiment, arsenic is implanted into the digital circuit forming area DA, and, in place of arsenic, phosphorus is implanted into the analog circuit forming area AA. In addition, without being limited to the configuration, the amount of arsenic implanted into the analog circuit forming area AA may be set smaller than that in the digital circuit forming area DA. These enable the amount of interstitial silicon in the analog circuit forming area AA to be reduced, which enables the TED of boron to be suppressed. In addition, although, in the present embodiment, the co-implantation of fluorine or carbon is performed in conjunction with the extension implantation to further suppress TED, the TED may be suppressed even without performing the co-implantation.

The concentration distribution of channel boron around the source region side has a greater influence on 1/f noise than that around the drain region side. For this reason, in the manufacturing method of the semiconductor device according to the present embodiment, the extension implantation is performed with different extension implantation conditions with regard to the source region side and the drain region side, as illustrated in FIGS. 9 and 10. In particular, preventing TED from occurring on the source region side is more effective for the reduction of 1/f noise than on the drain region side.

(Effects of Deep Source/Drain Implantation)

Figure 17A:
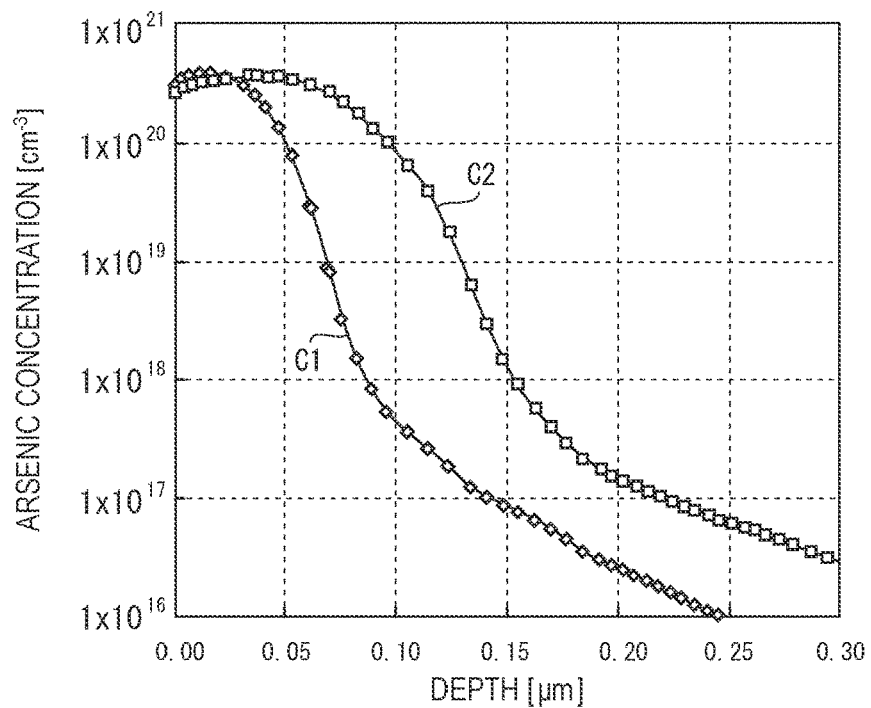
FIGS. 17A and 17B are views descriptive of the semiconductor device and a manufacturing method of the semiconductor device according to the first embodiment of the present invention and FIG. 17A is a diagram illustrative of arsenic distributions in deep source/drain regions and FIG. 17B is a diagram illustrative of depth direction distributions of boron at a position 10 nm inside from the end of an extension to the gate side.
Figure 17B:
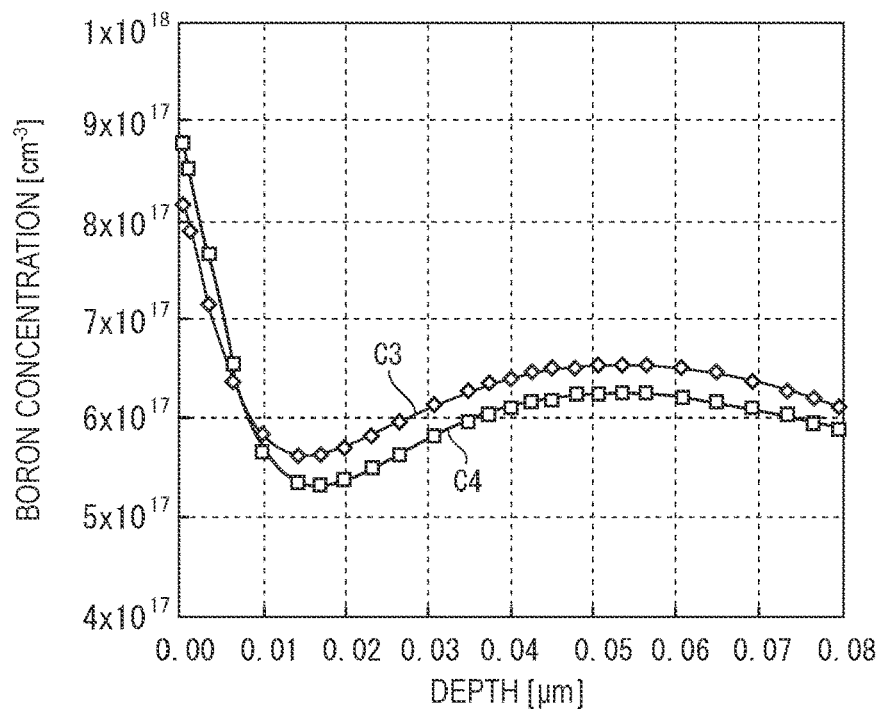

Next, effects of the deep source/drain implantation step in the manufacturing method of the semiconductor device according to the present embodiment will be described using FIGS. 17A and 17B. FIGS. 17A and 17B illustrate an example of impurity distributions obtained by performing process simulation with respect to a transistor having a gate length of 0.2 µm. The abscissas of graphs illustrated in FIGS. 17A and 17B indicate depth (µm) in the semiconductor substrate 3 with reference to the boundary face between the semiconductor substrate 3 and the gate oxide film (that is, the surface of the semiconductor substrate) (0 µm). The ordinates of the graphs illustrated in FIGS. 17A and 17B indicate the concentration of arsenic and the concentration of boron, respectively. A characteristic C1 connecting rhombuses and a characteristic C2 connecting squares in FIG. 17A represent distribution characteristics of arsenic in the case of shallow implantation of arsenic and in the case of deep implantation of arsenic, respectively. In addition, a characteristic C3 connecting rhombuses and a characteristic C4 connecting squares in FIG. 17B represent distribution characteristics of boron in the case of shallow implantation of arsenic and in the case of deep implantation of arsenic, respectively.

As described above, in the manufacturing method of the semiconductor device according to the present embodiment, a deep source/drain step dedicated to the analog circuit forming area AA is included (see FIG. 13). In the present embodiment, arsenic is implanted into the digital circuit forming area DA, and, in place of arsenic, phosphorus is implanted into the analog circuit forming area AA. In addition, without being limited to the configuration, the amount of arsenic implanted into the analog circuit forming area AA may be set smaller than that in the digital circuit forming area DA. These enable the amount of interstitial silicon in the analog circuit forming area AA to be reduced, which enables the TED of boron to be suppressed. In addition, although, in the present embodiment, the co-implantation of fluorine or carbon is performed in conjunction with the extension implantation to further suppress TED, the TED may be suppressed even without performing the co-implantation.

As illustrated in FIGS. 14 and 15, in the manufacturing method of the semiconductor device according to the present embodiment, the deep source/drain implantation is, as with the extension implantation, performed with different deep source/drain implantation conditions with regard to the source region side and the drain region side. In particular, TED may be prevented from occurring on the source region side rather than on the drain side.

FIG. 17A illustrates distributions of arsenic in the deep source/drain regions when concentration distributions of boron illustrated in FIG. 17B are obtained. FIG. 17B illustrates depth direction distributions of boron at a position 10 nm inside from the end of an extension to the gate side. As illustrated in FIG. 17B, the shallow implantation of arsenic into the deep source/drain regions (see the characteristic C3) causes the boron concentration around the boundary face between the gate insulating film ($SiO_2$) and the semiconductor substrate (Si) to be reduced to a lower level than the deep implantation of arsenic into the deep source/drain regions (see the characteristic C4). The reduction in boron concentration enables 1/f noise to be reduced.

Example 1

Figure 18:
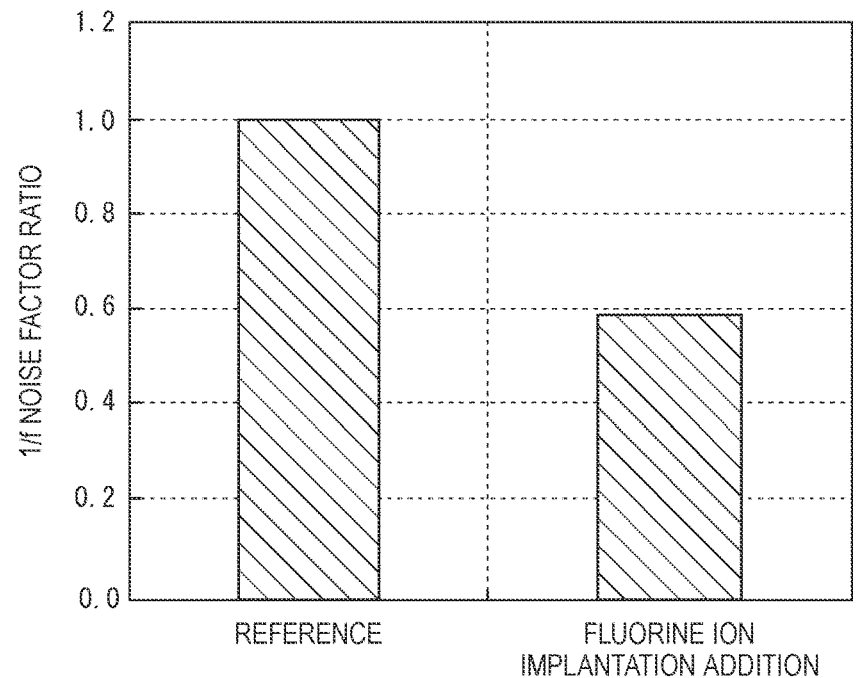
FIG. 18 is a view descriptive of the semiconductor device and a manufacturing method of the semiconductor device according to the first embodiment of the present invention and a diagram illustrative of an example of a 1/f noise factor ratio when fluorine ion implantation into both a source region side and a drain region side is added to an extension implantation step.

A semiconductor device and a manufacturing method of the semiconductor device according to an example 1 of the present embodiment will be described using FIG. 18. FIG. 18 illustrates an example of a 1/f noise factor ratio when fluorine ion implantation into both the source region side and the drain region side is added to the extension implantation step. The bar "reference" in FIG. 18 indicates a 1/f noise factor when the fluorine ion implantation is not added.

In FIG. 18, a 1/f noise factor (Kf) is calculated using the equation (1) below:

$$Kf = Svg \times Cox \times W \times L \times f \qquad (1).$$

The respective symbols in the equation (1) are as follows:
Svg: gate voltage equivalent noise;
Cox: gate oxide film capacitance;
W: gate width;
L: gate length; and
f: frequency.

In the example 1, phosphorus is used as impurities in the extension regions. The dose amounts of phosphorus and fluorine are $2 \times 10^{13}$ $cm^{-2}$ and $4 \times 10^{14}$ $cm^{-2}$, respectively. As illustrated in FIG. 18, performing co-implantation in the extension implantation step under the conditions enables the reverse short-channel effect to be suppressed and the 1/f noise factor ratio to be reduced by approximately 40%. In addition, with the dose amount of fluorine in a range from $1 \times 10^{14}$ $cm^{-2}$ to $1 \times 10^{15}$ $cm^{-2}$, a 40% to 60% noise reduction rate due to TED suppression may be achieved.

Example 2

Figure 19:
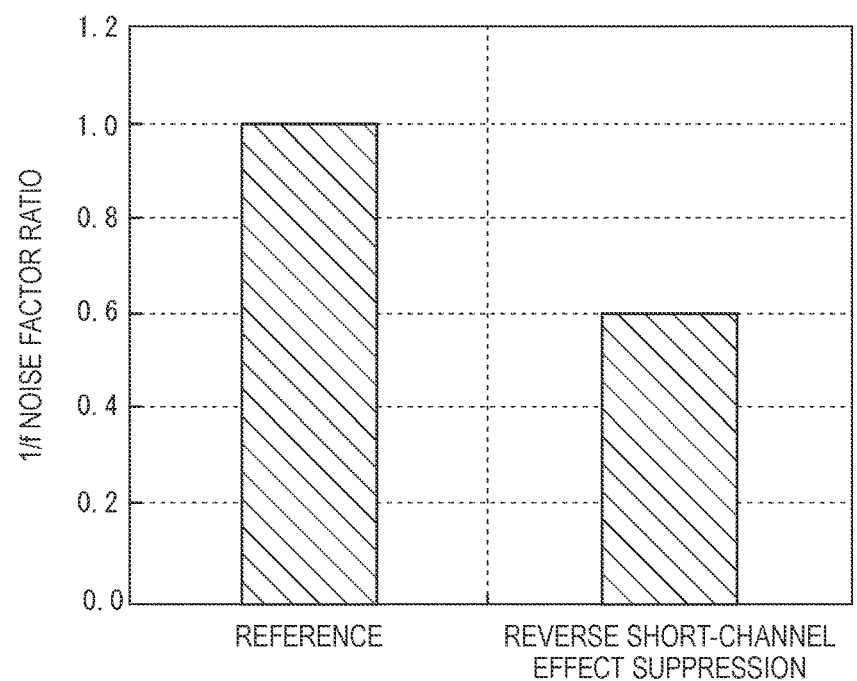
FIG. 19 is a view descriptive of the semiconductor device and a manufacturing method of the semiconductor device according to the first embodiment of the present invention and a diagram illustrative of an example of a 1/f noise factor ratio when ion implantation conditions in the deep source/drain regions are changed.

A semiconductor device and a manufacturing method of the semiconductor device according to an example 2 of the present embodiment will be described using FIG. 19. FIG. 19 illustrates an example of a 1/f noise factor ratio when ion implantation conditions (the implantation amount of arsenic and acceleration energy) into the deep source/drain regions are changed. The bar "reference" in FIG. 19 indicates a 1/f noise factor under the ion implantation conditions: "the implantation amount of arsenic: $5 \times 10^{15}$ cm$^{-2}$; and acceleration energy: 80 keV". The bar "reverse short-channel effect suppression" in FIG. 19 indicates a 1/f noise factor under the ion implantation conditions: "the implantation amount of arsenic: $3 \times 10^{15}$ cm$^{-2}$; and acceleration energy: 40 keV".

As illustrated in FIG. 19, the change in the ion implantation conditions so as to suppress the reverse short-channel effect enables 1/f noise to be reduced by approximately 40%.

As described thus far, the semiconductor device and the manufacturing method of the semiconductor device according to the present embodiment causes well concentration in the analog circuit MOS transistor to be lowered compared with the digital circuit transistor and, in conjunction therewith, impurity concentration in the source region and the drain region to be lowered or impurities in the source region and the drain region to have a shallow distribution. These configurations enable TED to be suppressed and 1/f noise to be reduced even when the gate length of the analog circuit MOS transistor is the same as the gate length that enables the digital circuit MOS transistor to achieve low power consumption. Because of this achievement, the semiconductor device and the manufacturing method thereof according to the present embodiment enable low power consumption in a digital circuit to be achieved and the influence of noise in an analog circuit to be reduced.

Second Embodiment (Schematic Configuration of Semiconductor Device)

First, a schematic configuration of a semiconductor device according to a second embodiment of the present invention will be described using FIG. 20. Hereinafter, in FIG. 20, and FIGS. 21 to 29 which illustrate a manufacturing process of the semiconductor device, an illustration of P-type MOS transistors is omitted and only N-type MOS transistors are illustrated.

Figure 20:
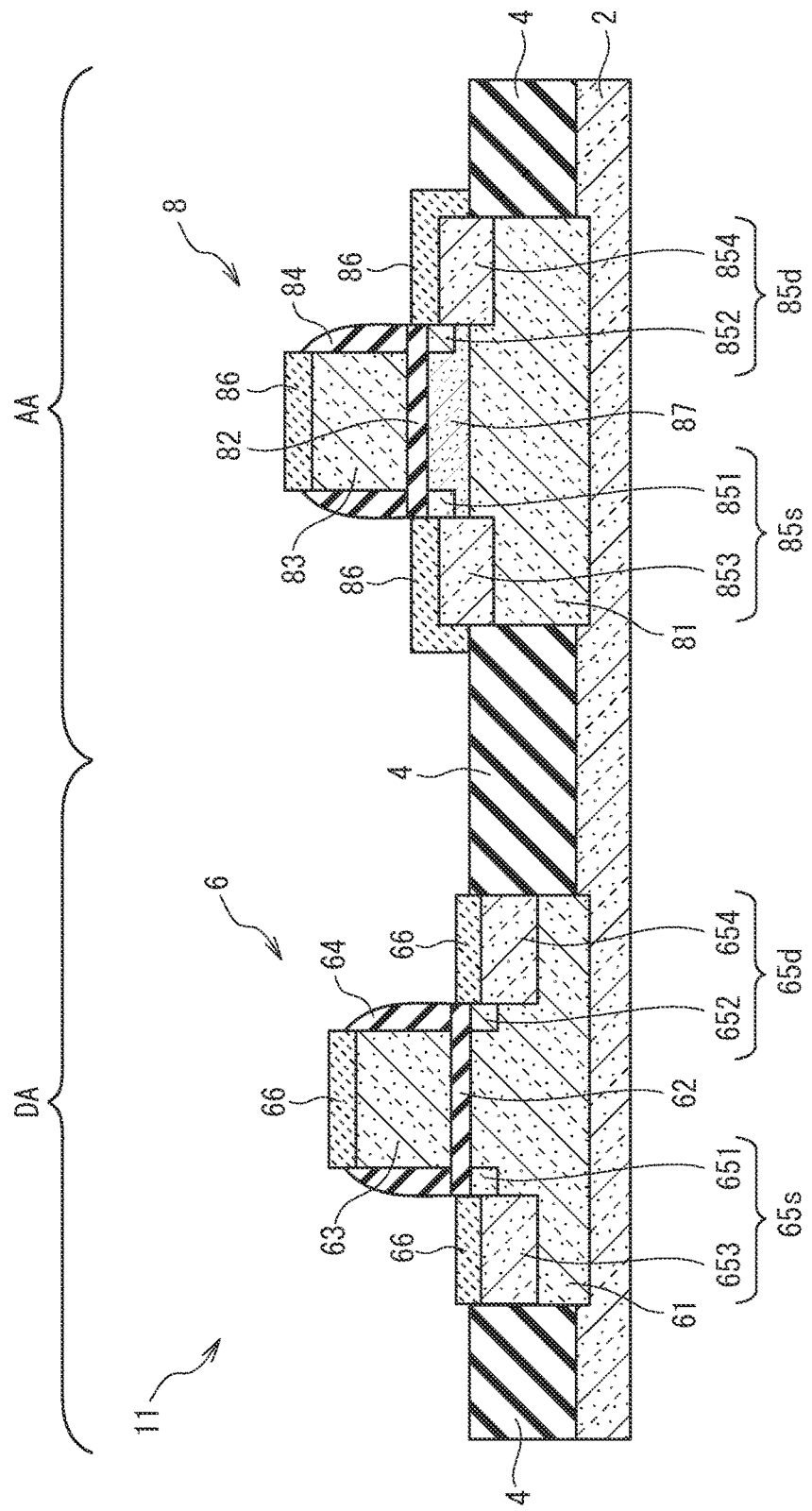
FIG. 20 is a cross-sectional view illustrative of a schematic configuration of a semiconductor device 11 according to a second embodiment of the present invention.

As illustrated in FIG. 20, a semiconductor device 11 according to the present embodiment includes a digital circuit N-type MOS transistor 6 that is formed in a digital circuit forming area DA and an analog circuit N-type MOS transistor 8 that is formed in an analog circuit forming area AA. As described above, the semiconductor device 11 is, as with the semiconductor device 1 according to the above-described first embodiment, a semiconductor device in which both of a digital circuit and an analog circuit formed.

The semiconductor device 11 includes an N-type (an example of a second conductivity type) semiconductor substrate 2. The semiconductor substrate 2 is, for example, an N-type semiconductor substrate or a P-type semiconductor substrate including deep N-wells. The semiconductor device 11 includes element separation layers 4 that are formed on the semiconductor substrate 2 and separate the semiconductor substrate 2 into the digital circuit forming area DA and the analog circuit forming area AA. The element separation layers 4 are formed of, for example, an STI oxide film or a LOCOS oxide film.

The semiconductor device 11 includes a P-type (an example of a first conductivity type) well layer (an example of a first well layer) 61 that is formed in the digital circuit forming area DA and a P-type well layer (an example of a second well layer) 81 that is formed in the analog circuit forming area AA. The well layers 61 and 81 are formed by ion implanting, for example, boron (B) into the semiconductor substrate 2.

The semiconductor device 11 includes a non-doped epi-silicon film (an example of a non-doped film) 87 that is formed on the surface of the P-type well layer 81. Although details will be described later, the non-doped epi-silicon film 87 is formed by performing epitaxial growth on the P-type well layer 81. The formation of the non-doped epi-silicon film causes the profile of impurity concentration in a channel region (region in which the non-doped epi-silicon film 87 and the P-type well layer 81 are laminated) to have a retrograde distribution.

The semiconductor device 11 includes a gate insulating film (an example of a first gate insulating film) 62 that is formed on the surface of the well layer 61 and a gate insulating film (an example of a second gate insulating film) 82 that is formed on the surface of the non-doped epi-silicon film 87. The gate insulating films 62 and 82 are formed of, for example, silicon dioxide ($SiO_2$).

The semiconductor device 11 includes a gate electrode (an example of a first gate electrode) 63 that is formed on the surface of the gate insulating film 62 and a gate electrode (an example of a second gate electrode) 83 that is formed on the surface of the gate insulating film 82. The gate electrodes 63 and 83 are formed of, for example, polysilicon.

The semiconductor device 11 includes sidewalls 64 and 84 that are formed of insulating films on the respective side surfaces of the gate electrodes 63 and 83. The sidewalls 64 and 84 are formed on the side surfaces of the gate electrodes 63 and 83, respectively. The insulating films that form the sidewalls 64 and 84 are made of, for example, $SiO_2$.

The semiconductor device 11 includes an N-type source region (an example of a first source region) 65s and an N-type drain region (an example of a first drain region) 65d that are formed in the well layer 61 with the gate electrode 63 interposed therebetween. The source region 65s includes an extension region 651 that is formed below the sidewall 64 and a deep source region 653 that is formed adjacent to the extension region 651. The deep source region 653 has a higher concentration of impurities (for example, arsenic (As)) than that in the extension region 651. The drain region 65d includes an extension region 652 that is formed below the sidewall 64 and a deep drain region 654 that is formed adjacent to the extension region 652. The deep drain region 654 has a higher concentration of impurities (for example, arsenic (As)) than that in the extension region 652.

The semiconductor device 11 includes an N-type source region (an example of a second source region) 85s and an N-type drain region (an example of a second drain region) 85d that are formed in the non-doped epi-silicon film 87 and the well layer 81 with the gate electrode 83 interposed therebetween. The source region 85s includes an extension region 851 that is formed below the sidewall 84 and a deep source region 853 that is formed adjacent to the extension region 851. The extension region 851 is formed in the non-doped epi-silicon film 87. The deep source region 853 is formed in the well layer 81. The extension region 851 is formed thinner than the non-doped epi-silicon film 87. The deep source region 853 has a higher concentration of impurities (for example, arsenic (As)) than that in the extension region 851. The drain region 85d includes an extension region 852 that is formed below the sidewall 84 and a deep drain region 854 that is formed adjacent to the extension region 852. The extension region 852 is formed in the non-doped epi-silicon film 87. The deep drain region 854 is formed in the well layer 81. The extension region 852 is formed thinner than the non-doped epi-silicon film 87. The deep drain region 854 has a higher concentration of impurities (for example, arsenic (As)) than that in the extension region 852.

The semiconductor device 11 includes silicide films 66 that are formed on the surfaces of the source region 65s, the drain region 65d, and the gate electrode 63 and silicide films 86 that are formed on the surfaces of the source region 85s, the drain region 85d, and the gate electrode 83. Although illustration is omitted, the semiconductor device 11 includes a protective layer that is formed over the digital circuit N-type MOS transistor 6 and the analog circuit N-type MOS transistor 8, electrode plugs that are embedded in contact halls and formed after removing portions of the protective layer over the source region 65s, the drain region 65d, the gate electrode 63, the source region 85s, the drain region 85d, and the gate electrode 83, and wiring connected to the electrode plugs. The silicide films 66 and 86 are formed to reduce contact resistance with the electrode plugs.

As described above, the digital circuit N-type MOS transistor 6, included in the semiconductor device 11, includes the well layer 61 formed on the semiconductor substrate 2, the gate insulating film 62 formed on a portion of the well layer 61, the gate electrode 63 formed on the gate insulating film 62, the sidewall 64 formed on the side surface of the gate electrode 63, the source region 65s and the drain region 65d formed in the well layer 61 with the gate electrode 63 interposed therebetween, and silicide films 66 formed on the source region 65s, the drain region 65d, and the gate electrode 63.

In addition, the analog circuit N-type MOS transistor 8, included in the semiconductor device 11, includes the well layer 81 formed on the semiconductor substrate 2, the non-doped epi-silicon film 87 formed on a portion of the well layer 81, the gate insulating film 82 formed on the non-doped epi-silicon film 87, the gate electrode 83 formed on the gate insulating film 82, the sidewall 84 formed on the side surface of the gate electrode 83, the source region 85s and the drain region 85d formed from the non-doped epi-silicon film 87 to the well layer 81 with the gate electrode 83 interposed therebetween, and silicide films 86 formed on the source region 85s, the drain region 85d, and the gate electrode 83.

The use of the non-doped epi-silicon film 87 enables the profile of impurity concentration of the analog circuit N-type MOS transistor 8 to have a retrograde distribution. For this reason, the impurity concentration around the boundary face between the non-doped epi-silicon film 87 and the gate insulating film 82 is reduced lower than the impurity concentration around the boundary face between the well layer 81 and the gate insulating film 82 when the gate insulating film 82 is formed directly on the well layer 81. For this reason, the non-doped epi-silicon film 87 may decrease the amount of overlap between interstitial silicon generated in ion implantation when the extension regions 851 and 852 are formed and channel impurities. Because of this effect, the semiconductor device 11 may suppress TED in the analog circuit forming area AA.

(Manufacturing Method of Semiconductor Device)

Next, a manufacturing method of the semiconductor device according to the present embodiment will be described, while referring to FIG. 20, using FIGS. 21 to 29. Although, in the present embodiment, a plurality of semiconductor devices are formed on one semiconductor wafer simultaneously, cross-sectional views illustrating manufacturing process with regard to a pair of a digital circuit N-type MOS transistor and an analog circuit N-type MOS transistor out of the plurality of semiconductor devices will be illustrated in FIGS. 21 to 29. In addition, in FIGS. 21 to 29, hatching is given only to newly formed components (for example, a gate electrode and a resist pattern) and the like to facilitate understanding.

Figure 21:
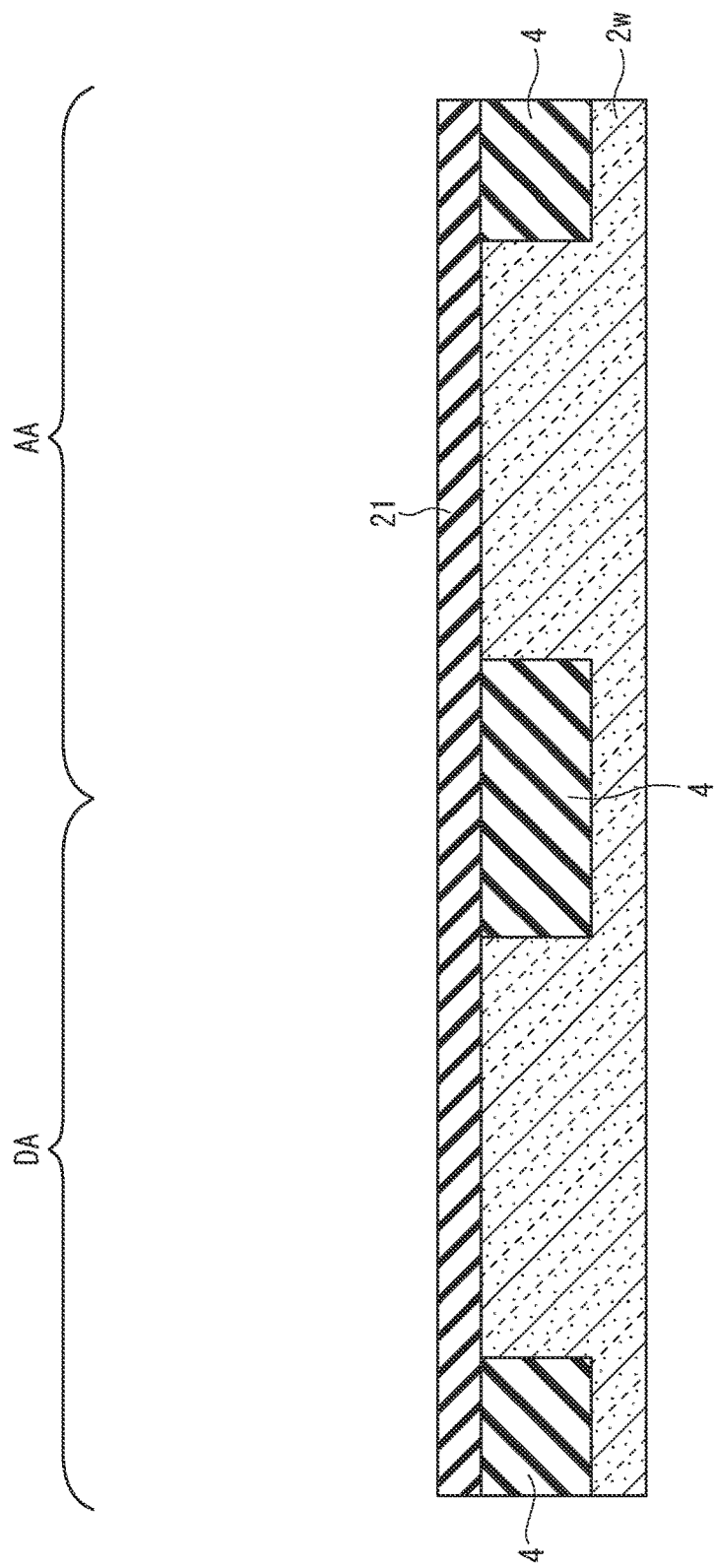
FIG. 21 is a cross-sectional view illustrating manufacturing process descriptive of a manufacturing method of the semiconductor device according to the second embodiment of the present invention and a diagram descriptive of an element separation layer forming step.

First, a semiconductor wafer 2w, which is formed of, for example, silicon, is prepared. Next, as illustrated in FIG. 21, after the semiconductor wafer 2w has been element-separated by forming a plurality of element separation layers 4 on the semiconductor wafer 2w (an example of an element separation layer forming step), a through film for channel ion implantation is formed (through film forming step). Specifically, in the through film forming step, the semiconductor wafer 2w is thermally oxidized to forma silicon dioxide ($SiO_2$) film, which serves as a through film 21, on the whole surface of the semiconductor wafer 2w including the element separation layers 4.

Figure 22:
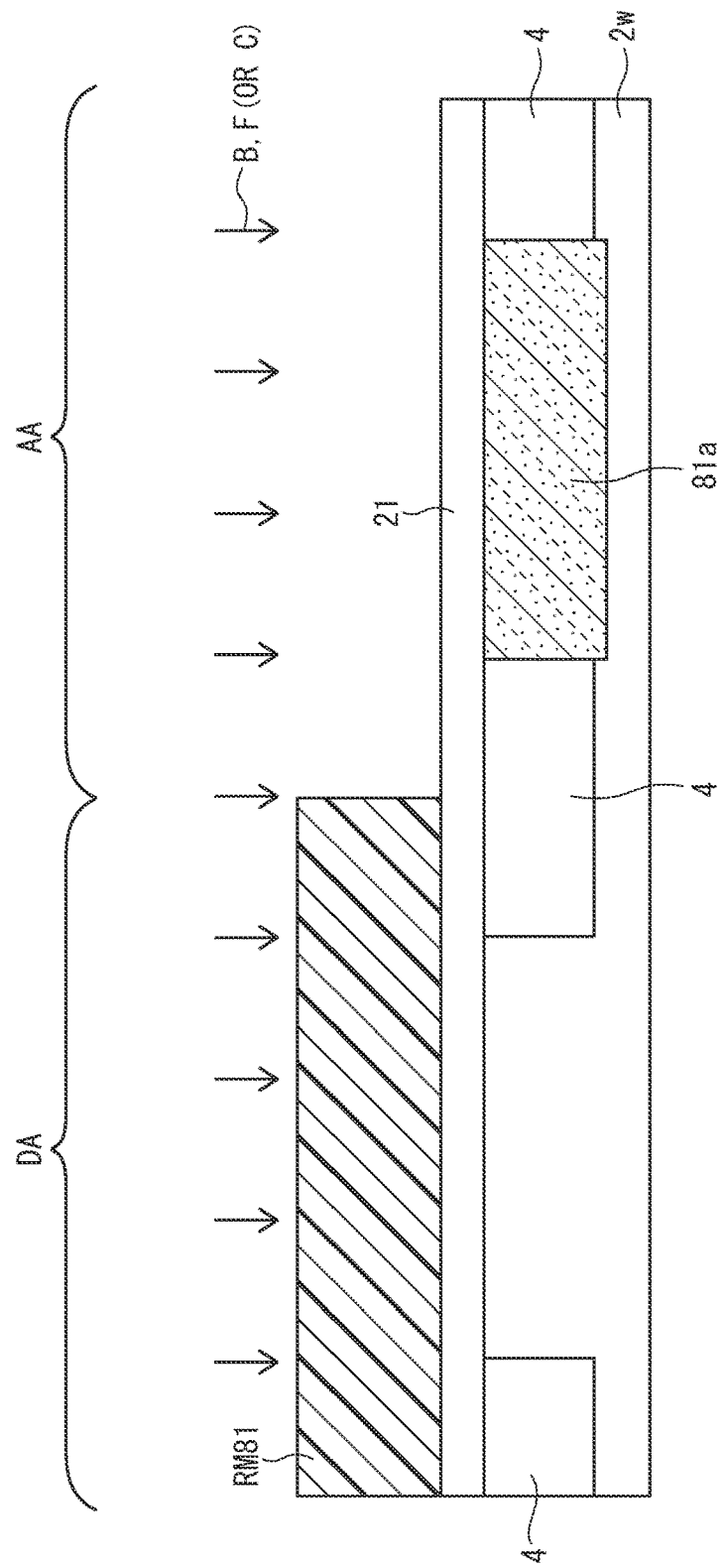
FIG. 22 is a cross-sectional view illustrating manufacturing process descriptive of the manufacturing method of the semiconductor device according to the second embodiment of the present invention and a diagram descriptive of a second well layer forming step.

Next, a channel ion implantation step (an example of a second well layer forming step) of performing ion implantation and a step of performing co-implantation into a region in the semiconductor wafer 2w that eventually serves as a channel region of the analog circuit N-type MOS transistor 8 are performed. Specifically, in the channel ion implantation step and co-implantation step, a resist is coated on the whole surface of the through film 21, and patterning is performed. The resist coating and patterning form a resist mask RM81 opening at a predetermined region in the analog circuit forming area AA that eventually serves as a channel region of the analog circuit N-type MOS transistor 8, as illustrated in FIG. 22. Next, using the resist mask RM81 as a mask, for example, boron (B), as impurities of a first conductivity type, is ion implanted into the semiconductor wafer 2w. In addition, fluorine (F) or carbon (C) is co-implanted in conjunction with boron. The ion implantation and co-implantation forma second impurity layer 81a.

Although details will be described later, since the non-doped epi-silicon film 87 is grown in the analog circuit forming area AA, impurity concentration at the silicon surface of the semiconductor wafer 2w (that is, the surface of the second impurity layer 81a) becomes low. For this reason, formation of the second impurity layer 81a under the same conditions as channel ion implantation conditions when the non-doped epi-silicon film 87 is not grown would cause the threshold voltage of the analog circuit N-type MOS transistor 8, which is eventually to be formed, to decrease. Therefore, in the present embodiment, in order to set the threshold voltage of the analog circuit N-type MOS transistor 8 at a desired value, the amount of channel dose is increased larger than that in the channel ion implantation conditions when the non-doped epi-silicon film 87 is not grown (for example, the channel ion implantation conditions for the second impurity layer 91a in the first embodiment).

Figure 23:
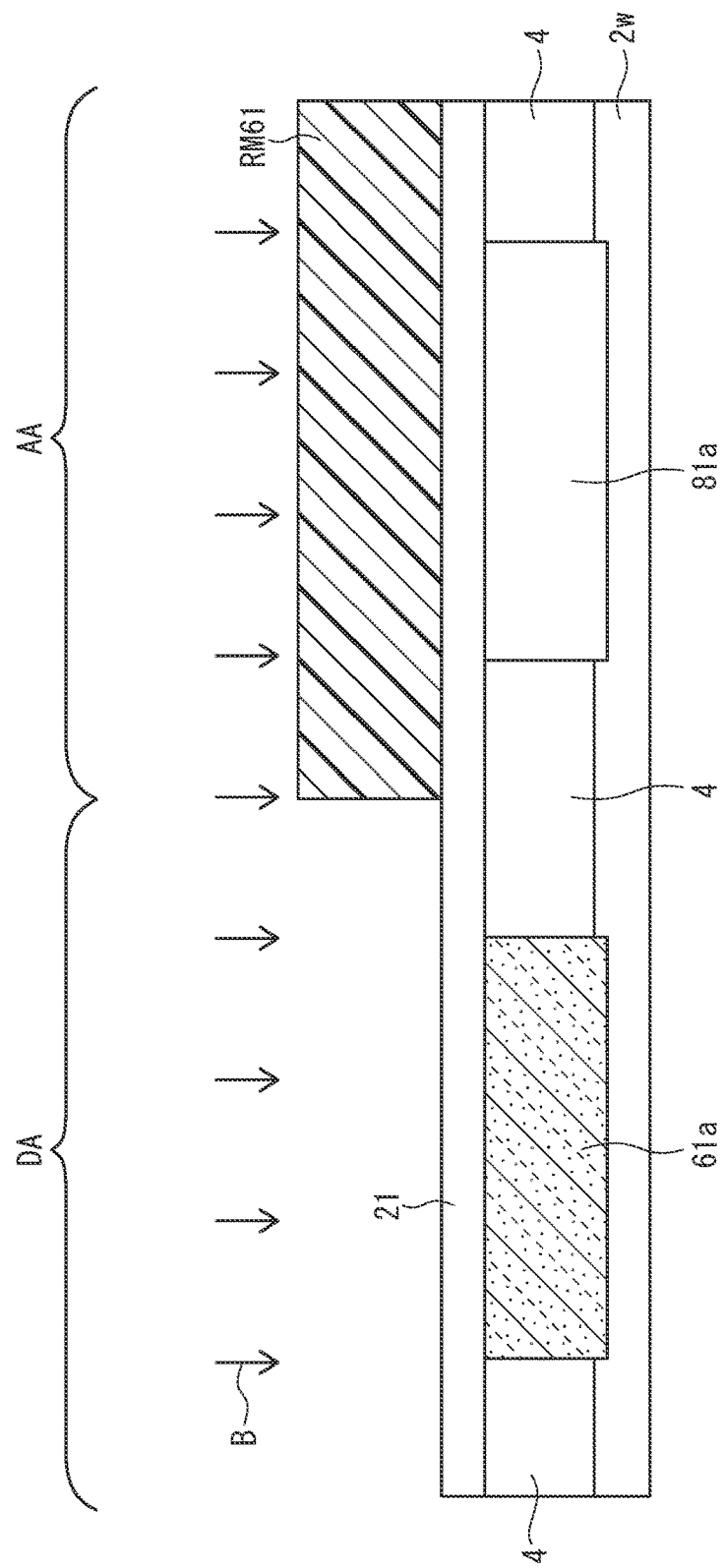
FIG. 23 is a cross-sectional view illustrating manufacturing process descriptive of the manufacturing method of the semiconductor device according to the second embodiment of the present invention and a diagram descriptive of a first well layer forming step.

Next, a channel ion implantation step (an example of a first well layer forming step) of performing ion implantation into a region in the semiconductor wafer 2w that eventually serves as a channel region of the digital circuit N-type MOS transistor 6 is performed. Specifically, in the channel ion implantation step, a resist is coated on the whole surface of the through film 21, and patterning is performed. The resist coating and patterning form a resist mask RM61 opening at a predetermined region in the digital circuit forming area DA that eventually serves as a channel region of the digital circuit N-type MOS transistor 6, as illustrated in FIG. 23. Next, using the resist mask RM61 as a mask, for example, boron (B), as impurities of the first conductivity type, is ion implanted into the semiconductor wafer 2w. The ion implantation forms a first impurity layer 61a. Note that either the ion implantation step illustrated in FIG. 23, or the channel ion implantation step and co-implantation step illustrated in FIG. 22 may be performed first.

Next, after the resist mask RM61 has been removed, the first impurity layer 61a and the second impurity layer 81a are activated to include channel regions (channel activation). The channel activation forms the well layer 61 and the well layer 81 in the formation regions of the first impurity layer 71a and the second impurity layer 81a, respectively. In the present embodiment, an example of a first well layer forming step and an example of a second well layer forming step may be considered to be including the channel activation step.

Figure 24:
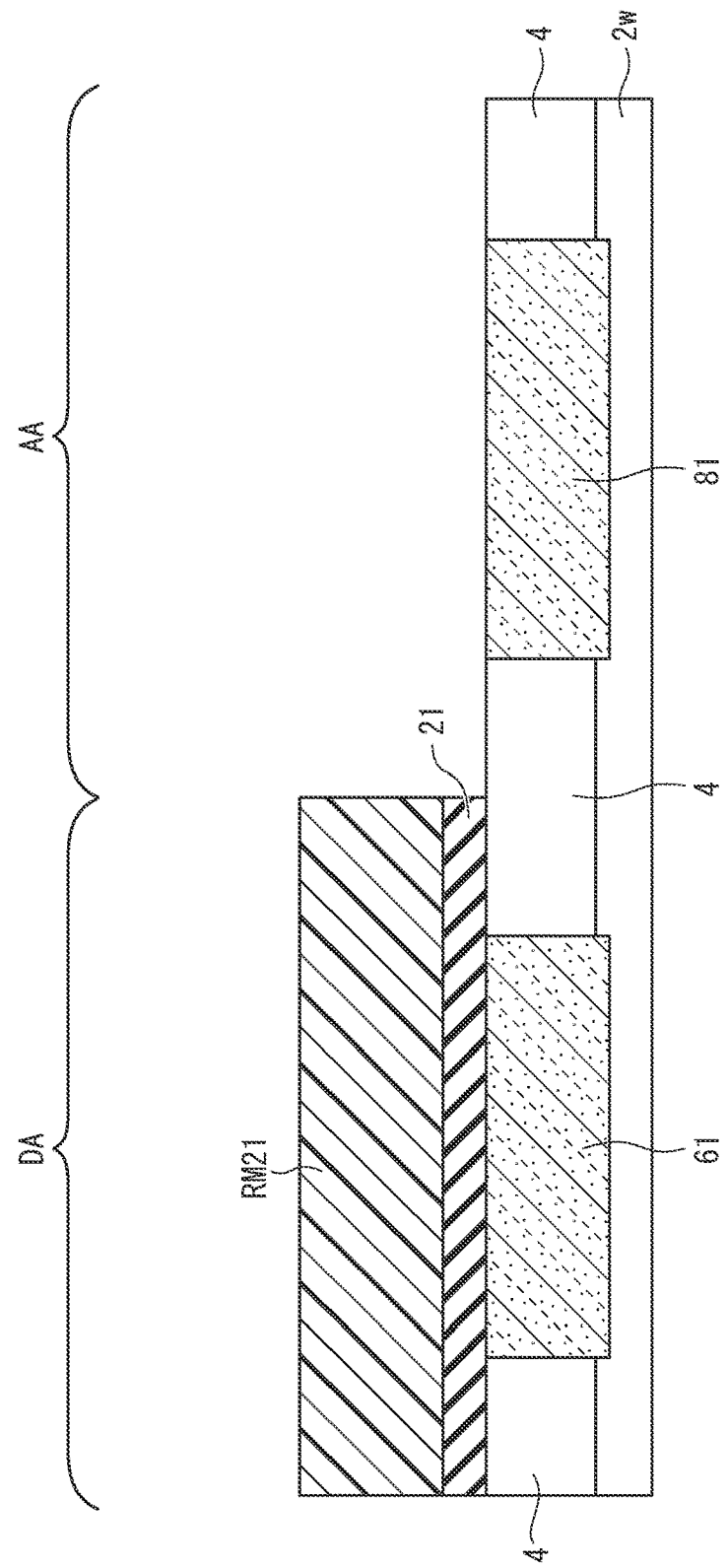
FIG. 24 is a cross-sectional view illustrating manufacturing process descriptive of the manufacturing method of the semiconductor device according to the second embodiment of the present invention and a diagram descriptive of a step of opening an analog circuit forming area.

Next, a resist is coated on the whole surface of the through film 21, and patterning is performed. The resist coating and patterning forma resist mask RM21 opening at the analog circuit forming area AA, as illustrated in FIG. 24. Next, using the resist mask RM21 as a mask, a portion of the through film 21 that is formed in the analog circuit forming area AA is removed by wet etching to suppress defects generation on the surface of well layer 81. The resist coating and patterning open the analog circuit forming area AA, which exposes the well layer 81, as illustrated in FIG. 24.

Next, a non-doped film forming step of selectively growing the non-doped epi-silicon film 87 on the surface of the semiconductor substrate (that is, the semiconductor wafer 2w) in the analog circuit forming area AA is performed. In the non-doped film forming step, first, the resist mask RM21 is removed by means of dry ashing and ammonium hydrogen-peroxide mixture (APM) cleaning. High-temperature APM cleaning increases silicon substrate surface roughness. For this reason, in the present embodiment, the APM cleaning is performed at low temperature so as not to increase the surface roughness of the semiconductor wafer 2w. However, since cleaning at too low temperature decreases cleaning performance, the APM cleaning is preferably performed at a temperature in a range from 45° C. to 55° C.

Figure 25:
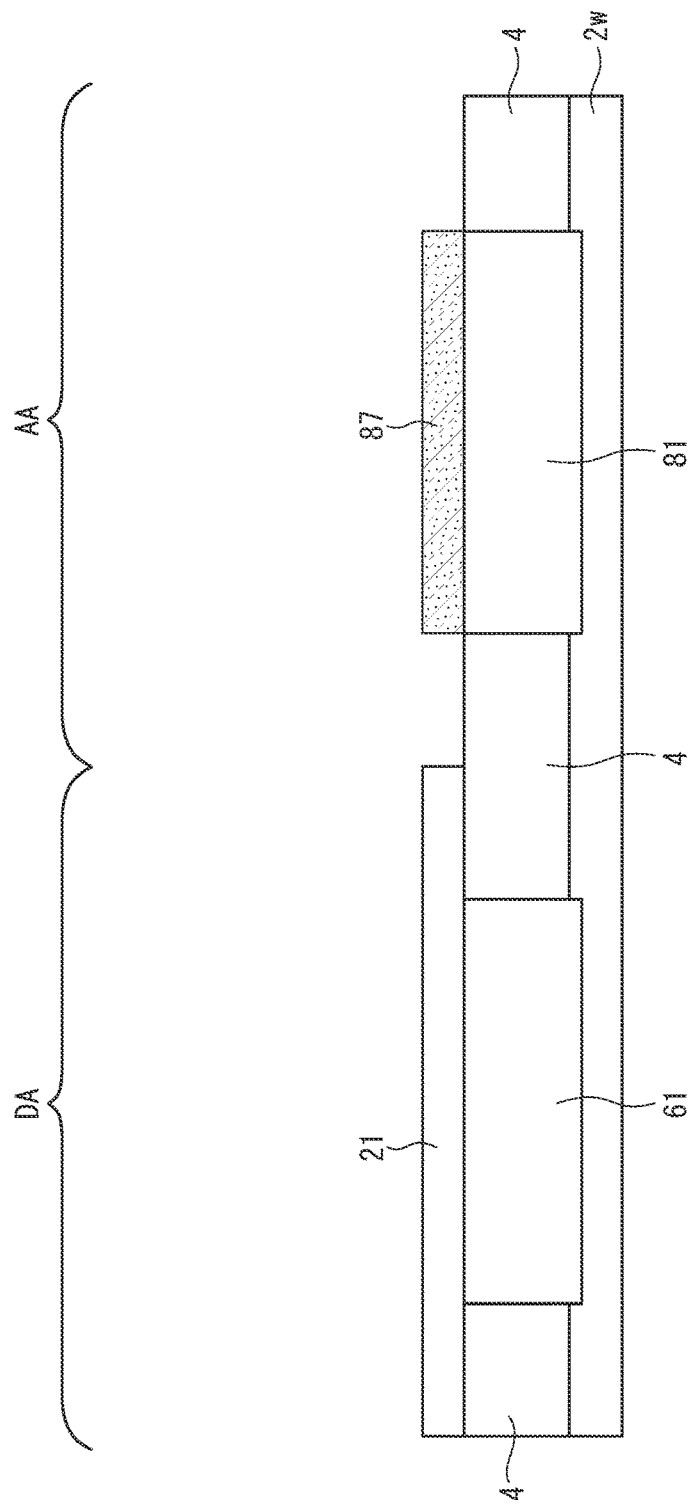
FIG. 25 is a cross-sectional view illustrating manufacturing process descriptive of the manufacturing method of the semiconductor device according to the second embodiment of the present invention and a diagram descriptive of a non-doped film forming step.

After the APM cleaning has been performed, a chemical oxide film having a thickness of 1 nm or less is formed on the silicon surface in the analog circuit forming area AA. For this reason, after the chemical oxide film formed in the analog circuit forming area AA has been removed by means of hydrofluoric acid cleaning, the semiconductor wafer 2w is transferred to an epitaxial growth apparatus. During the transfer of the semiconductor wafer 2w to the epitaxial growth apparatus after hydrofluoric acid cleaning, a natural oxide film grows on the silicon surface in the analog circuit forming area AA (that is, the surface of the well layer 81). Formation of a non-doped epi-silicon film with a natural oxide film grown on a silicon surface causes the quality of the non-doped epi-silicon film to deteriorate, such as a deterioration in interface state density and a reduction in mobility. For this reason, after the semiconductor wafer 2w has been transferred to the epitaxial growth apparatus, the natural oxide film, which is formed on the surface of the well layer 81 in the analog circuit forming area AA, is removed by performing hydrogen annealing at a temperature in a range from 850° C. to 950° C. for approximately one minute. Subsequently, as illustrated in FIG. 25, the non-doped epi-silicon film 87 is epitaxially grown on the well layer 81. The non-doped epi-silicon film 87 is formed only on the well layer 81 and not on the through film 21 and the element separation layer 4.

Next, a gate insulating film forming step of forming the gate insulating films 62 and 82 on the surface of the semiconductor substrate (that is, the semiconductor wafer 2w) in the digital circuit forming area DA and the surface of the non-doped epi-silicon film 87 in the analog circuit forming area AA is performed.

Figure 26:
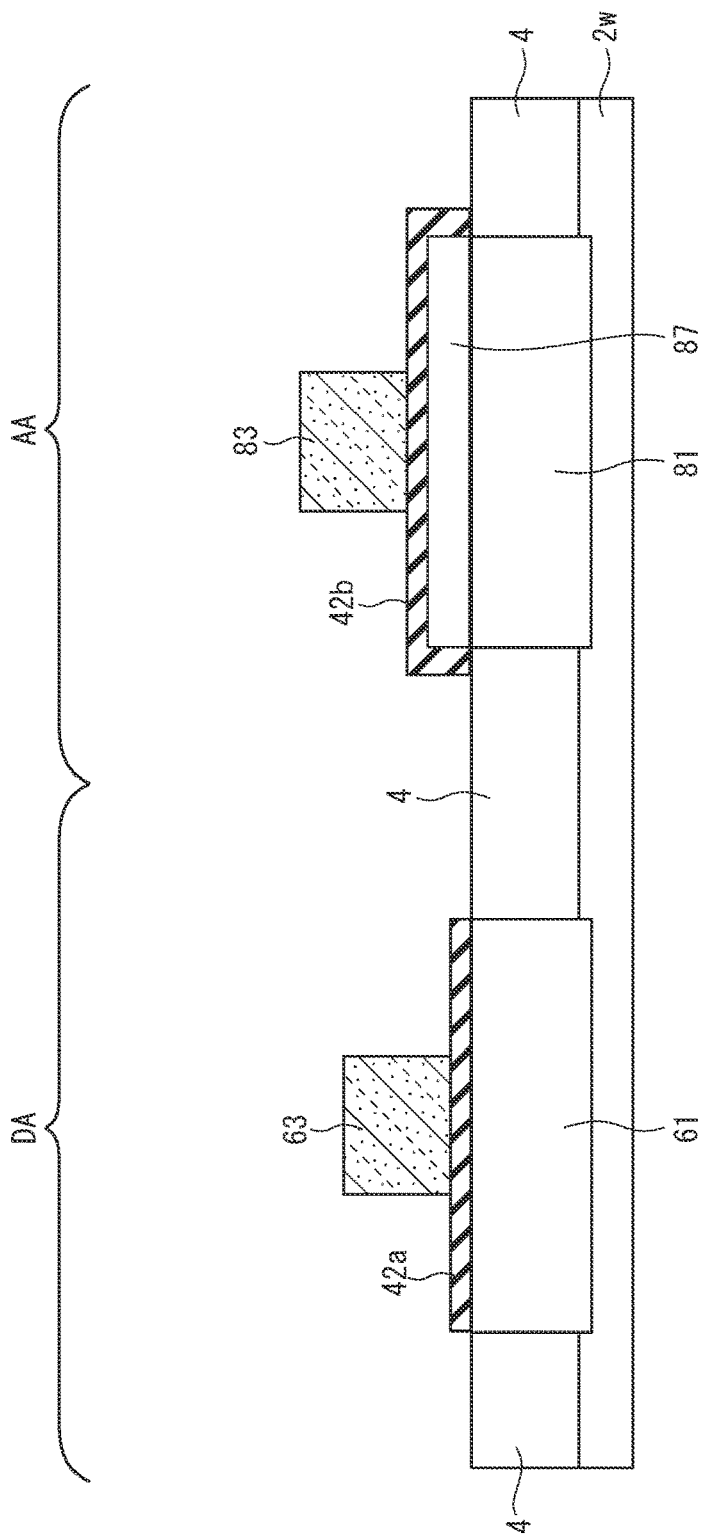
FIG. 26 is a cross-sectional view illustrating manufacturing process descriptive of the manufacturing method of the semiconductor device according to the second embodiment of the present invention and a diagram descriptive of a gate insulating film forming step and a gate electrode forming step.

In the gate insulating film forming step, an insulating film 42a is formed on the well layer 61, and an insulating film 42b that covers the upper surface and the side surface of the non-doped epi-silicon film 87 is formed, as illustrated in FIG. 26. Portions of the respective ones of the insulating films 42a and 42b eventually serve as the gate insulating films.

Next, for example, a polysilicon film is formed on the whole surface of the semiconductor wafer 2w including the insulating films 42a and 42b. Next, by coating a resist on the whole surface of the polysilicon film and performing patterning, resist masks that are resists eventually left unremoved on the formation regions of the gate electrodes 63 and 83 are formed. Next, the polysilicon film is etched using the resist masks as masks, and the resist masks are subsequently removed. The above steps form the gate electrodes 63 and 83 on the surfaces of the insulating films 42a and 42b, respectively, as illustrated in FIG. 26 (an example of a gate electrode forming step). Subsequently, re-oxidation is performed on the semiconductor wafer 2w.

Next, an extension implantation step (an example of a second conductivity type impurity layer forming step) of performing ion implantation into regions in the semiconductor wafer 2w that eventually serve as the extension regions 651 and 652 of the digital circuit N-type MOS transistor 6 and the extension regions 851 and 852 of the analog circuit N-type MOS transistor 8 is performed. Specifically, in the extension implantation step, by ion implanting, for example, arsenic (As) as impurities of the second conductivity type into the semiconductor wafer 2w using the gate electrodes 63 and 83 as masks, the extension implantation is performed. In order to suppress transient enhanced diffusion, the ion implantation is performed so that the mean range of extension implantation in the analog circuit forming area AA is shallower than or equal to the thickness of the non-doped epi-silicon film 87.

Figure 27:
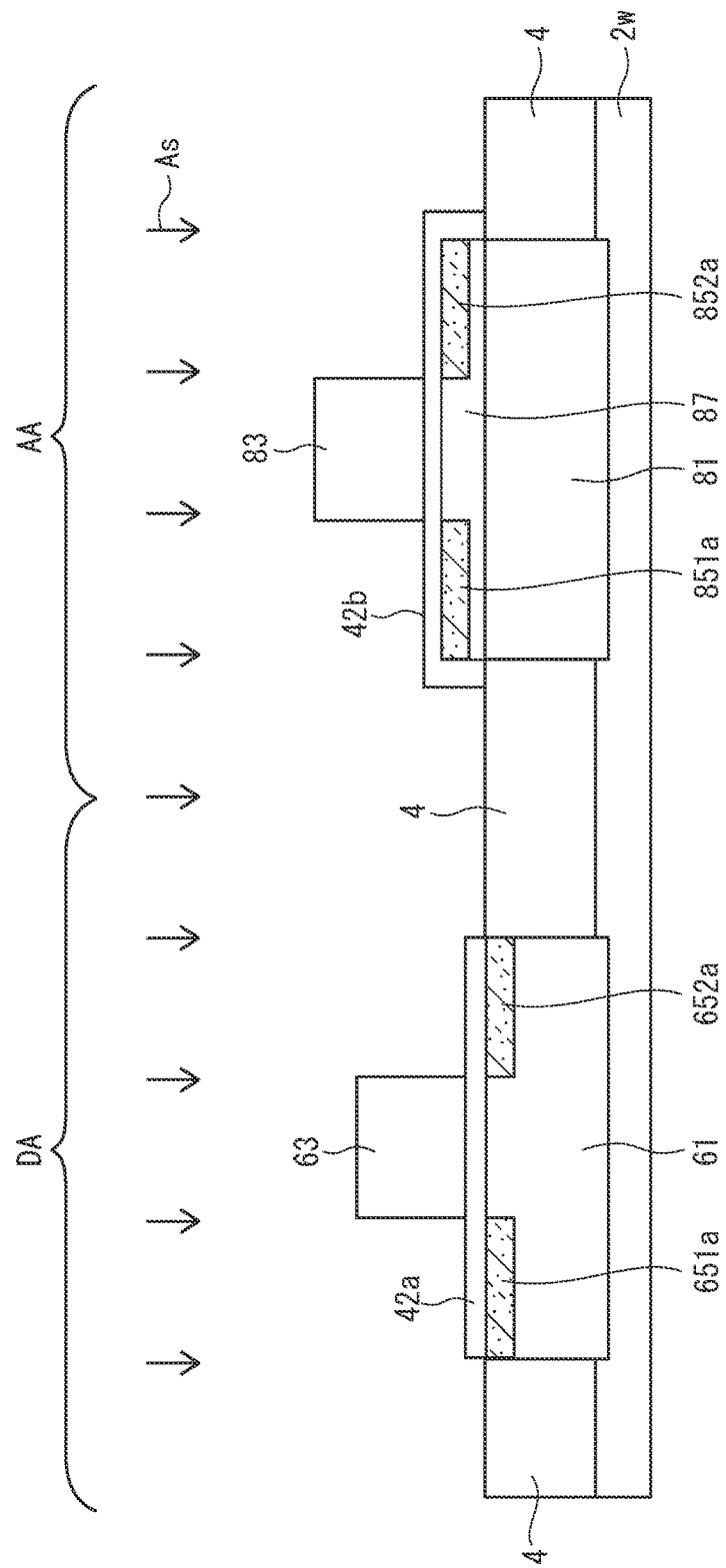
FIG. 27 is a cross-sectional view illustrating manufacturing process descriptive of the manufacturing method of the semiconductor device according to the second embodiment of the present invention and a diagram descriptive of a second conductivity type impurity layer forming step.

As illustrated in FIG. 27, the extension implantation forms second conductivity type impurity layers (an example of an analog side second conductivity type impurity layer) 851a and 852a in the non-doped epi-silicon film 87 on both sides of the gate electrode 83 in the analog circuit forming area AA and second conductivity type impurity layers (an example of a digital side second conductivity type impurity layer) 651a and 652a in the well layer 61 on both sides of the gate electrode 63 in the digital circuit forming area DA.

As described above, the extension implantation step includes a digital side second conductivity type impurity layer forming step of forming the second conductivity type impurity layers 651a and 652a by implanting impurities of the second conductivity type into the well layer 61 using the gate electrode 63 as a mask and an analog side second conductivity type impurity layer forming step of forming the second conductivity type impurity layers 851a and 852a by implanting impurities of the second conductivity type into the non-doped epi-silicon film 87 using the gate electrode 83 as a mask. In the present embodiment, the digital side second conductivity type impurity layer forming step and the analog side second conductivity type impurity layer forming step are performed simultaneously.

Next, by performing annealing for activating extension impurities on the semiconductor wafer 2w, the second conductivity type impurity layers 651a and 652a and the second conductivity type impurity layers 851a and 852a are activated. The activation annealing forms the extension regions 651 and 652 and the extension regions 851 and 852 in the formation regions of the second conductivity type impurity layers 651a and 652a and the formation regions of the second conductivity type impurity layers 851a and 852a, respectively (see FIG. 20). In the present embodiment, an example of the second conductivity type impurity layer forming step may be considered to be including the extension impurity activation annealing step.

Figure 28:
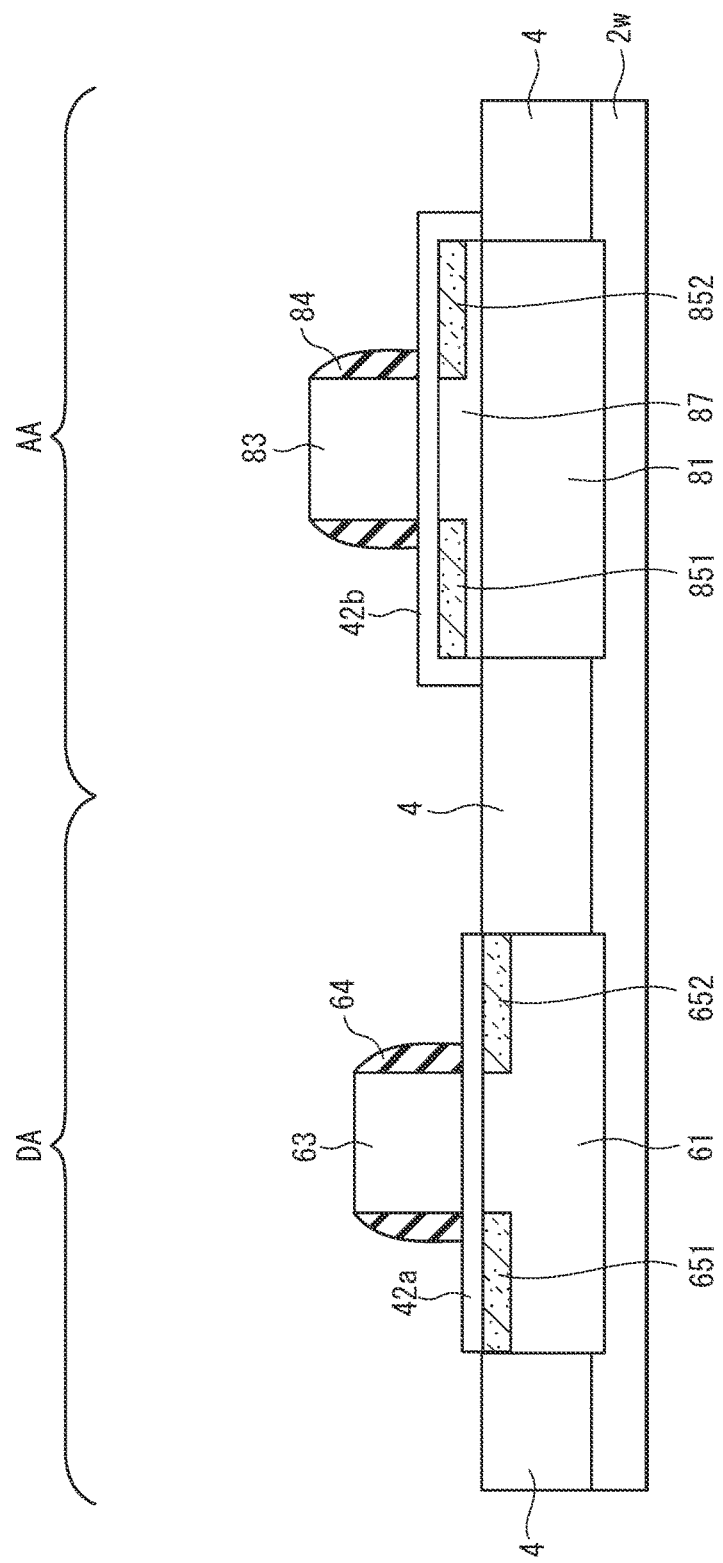
FIG. 28 is a cross-sectional view illustrating manufacturing process descriptive of the manufacturing method of the semiconductor device according to the second embodiment of the present invention and a diagram descriptive of a sidewall forming step.

Next, as illustrated in FIG. 28, a step (sidewall forming step) of forming the sidewalls 64 and 84 made of insulating films on the respective side surfaces of the gate electrodes 63 and 83 is performed. The sidewalls 64 and 84 are formed by depositing an insulating film using a chemical vapor deposition (CVD) method and performing anisotropic etching.

Next, a source/drain forming step of, by implanting impurities of the second conductivity type into the digital side second conductivity type impurity layers and the analog side second conductivity type impurity layers using the gate electrode 63, the gate electrode 83, and the sidewalls 64 and 84 as masks, forming the source region 65s and the drain region 65d in the digital side second conductivity type impurity layers and the source region 85s and the drain region 85d in the analog side second conductivity type impurity layers is performed.

Figure 29:
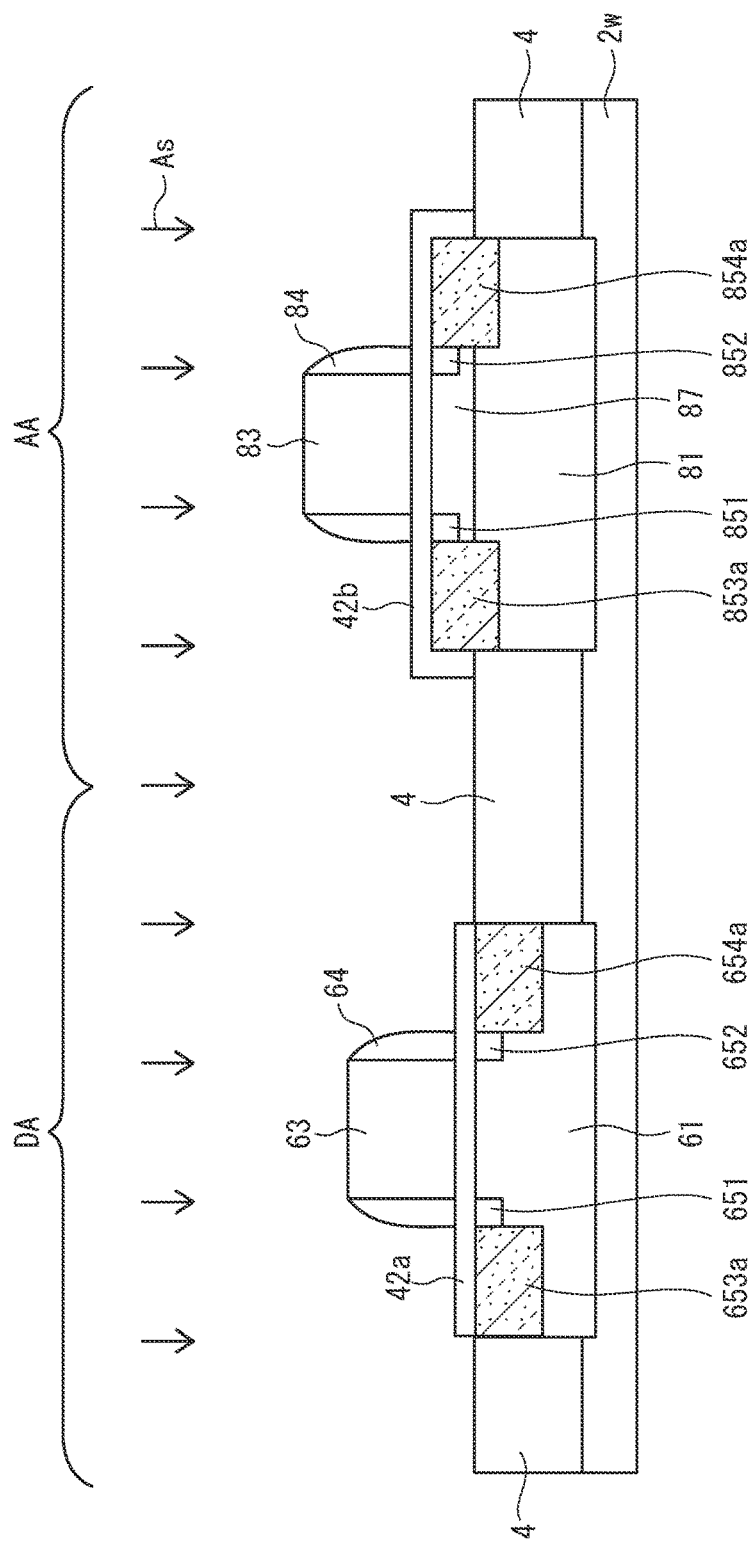
FIG. 29 is a cross-sectional view illustrating manufacturing process descriptive of the manufacturing method of the semiconductor device according to the second embodiment of the present invention and a diagram descriptive of a deep source/drain region forming step for forming source/drain regions.

Specifically, in the source/drain forming step, by ion implanting, for example, arsenic (As) as impurities of the second conductivity type into the semiconductor wafer 2w using the gate electrode 63 and the sidewall 64 as a mask and ion implanting, for example, arsenic (As) as impurities of the second conductivity type into the semiconductor wafer 2w using the gate electrode 83 and the sidewall 84 as a mask, deep source/drain implantation is performed. The deep source/drain implantation forms second conductivity type deep impurity layers 653a and 654a in the well layer 61 on both sides of the gate electrode 63 and second conductivity type deep impurity layers 853a and 854a in the well layer 81 on both sides of the gate electrode 83, as illustrated in FIG. 29. Impurities in the second conductivity type deep impurity layers 653a and 654a are implanted into the well layer 61 deeper than the extension region 651 and 652. In addition, impurities in the second conductivity type deep impurity layers 853a and 854a are implanted into the well layer 81 to a position deeper than the thickness of the non-doped epi-silicon film 87.

Next, by performing activation annealing on the semiconductor wafer 2w, the second conductivity type deep impurity layers 653a and 654a and the second conductivity type deep impurity layers 853a and 854a are activated. The activation annealing forms the deep source region 653 and the deep drain region 654 in the formation regions of the second conductivity type deep impurity layers 653a and 654a, respectively. The activation annealing also forms the deep source region 853 and the deep drain region 854 in the formation regions of the second conductivity type deep impurity layers 853a and 854a, respectively. As a result, the source region 65s including the extension region 651 and the deep source region 653 and the drain region 65d including the extension region 652 and the deep drain region 654 are formed in the well layer 61 on both sides of the gate electrode 63, as illustrated in FIG. 20. In addition, the source region 85s including the extension region 851 and the deep source region 853 and the drain region 85d including the extension region 852 and the deep drain region 854 are formed in the well layer 81 on both sides of the gate electrode 83. In the present embodiment, an example of the source/drain forming step may be considered to be including the activation annealing step.

Next, using the gate electrode 63 and the sidewall 64 as a mask, the insulating film 42a is etched, and, using the gate electrode 83 and the sidewall 84 as a mask, the insulating film 42b is etched. The insulating films 42a and 42b are etched simultaneously. The etching forms the gate insulating film 62 below the gate electrode 63 and the sidewall 64 and the gate insulating film 82 below the gate electrode 83 and sidewall 84, as illustrated in FIG. 20.

Next, a step (silicide film forming step) of forming silicide films on the surfaces of the source region 65s, the drain region 65d, and the gate electrode 63 and the source region 85s, the drain region 85d, and the gate electrode 83 is performed. In the silicide film forming step, a metal film is formed on the whole surface of the semiconductor wafer 2w including the source region 65s, the drain region 65d, and the gate electrode 63 and the source region 85s, the drain region 85d, and the gate electrode 83, and annealing treatment is performed on the metal film. The annealing treatment causes the surfaces of the source region 65s, the drain region 65d, and the gate electrode 63 and the source region 85s, the drain region 85d, and the gate electrode 83 and the metal film to react with each other and silicides to be formed. Subsequently, unnecessary metal films are removed by chemical solution treatment. As a result, the silicide films 66 are formed on the source region 65s, the drain region 65d, and the gate electrode 63, and the silicide films 86 are formed on the source region 85s, the drain region 85d, and the gate electrode 83, as illustrated in FIG. 20.

In this way, the digital circuit N-type MOS transistor 6 and the analog circuit N-type MOS transistor 8 are formed in the digital circuit forming area DA and the analog circuit forming area AA, respectively.

Although illustration is omitted, subsequently, a protective layer is formed on the whole surface of the semiconductor wafer 2w including the digital circuit N-type MOS transistor 6 and the analog circuit N-type MOS transistor 8. Next, contact holes are formed in predetermined regions of the protective layer, and, in the contact holes, electrode plugs electrically connected to the source region 65s, the drain region 65d, and the gate electrode 63 and the source region 85s, the drain region 85d, and the gate electrode 83 are formed. Next, wiring connected to the electrode plugs is formed. Next, the semiconductor wafer 2w is cut at predetermined positions into individual pieces. The step completes the semiconductor device 11 including the digital circuit N-type MOS transistor 6 and the analog circuit N-type MOS transistor 8.

As described thus far, the manufacturing method of the semiconductor device according to the present embodiment includes the non-doped film forming step of selectively growing the non-doped epi-silicon film 87 as a non-doped film on the surface of the semiconductor wafer 2w in the analog circuit forming area AA and the second conductivity type impurity layer forming step of, by implanting impurities of the second conductivity type into the well layer 61 and non-doped epi-silicon film 87 with a mean range shallower than or equal to the thickness of the non-doped epi-silicon film 87, forming the second conductivity type impurity layers 651a and 652a in the well layer 61 and the second conductivity type impurity layers 851a and 852a in the non-doped epi-silicon film 87.

Accordingly, the manufacturing method of the semiconductor device according to the present embodiment enables a profile of impurity concentration having a retrograde distribution to be formed in the non-doped epi-silicon film 87 and the well layer 81 without performing a complicated impurity implantation step such as setting special impurity implantation conditions. In addition, the manufacturing method of the semiconductor device according to the present invention enables the second conductivity type impurity layers 851a and 852a to be formed in the non-doped epi-silicon film 87, which is a non-doped region having a retrograde distribution. As described above, the manufacturing method of the semiconductor device according to the present embodiment enables the amount of overlap between interstitial silicon generated in the ion implantation when the extension regions 851 and 852 are formed and channel impurities to be decreased, which enables TED in the analog circuit forming area AA to be suppressed.

The present invention may be embodied with various modifications without being limited to the above embodiments.

Although, in the above-described first embodiment, co-implantation is performed in both the extension implantation step (an example of the analog side second conductivity type impurity layer forming step) and the deep source implantation step (an example of the second source/drain forming step), the present invention is not limited to the configuration. The co-implantation step may be performed in either the extension implantation step or the deep source implantation step.

Although, in the above-described first embodiment, the second conductivity type impurity layers 951a and 952a are formed in the well layer 91 on both sides of the gate electrode 93 by implanting phosphorous (P) as impurities in the extension implantation step (an example of the analog side second conductivity type impurity layer forming step), the present invention is not limited to the configuration. For example, arsenic (As), in place of phosphorus (P), may be implanted. In this case, arsenic is implanted in such a way that the second conductivity type impurity layers 951a and 952a have a shallower arsenic distribution than that of the second conductivity type impurity layers 751a and 752a, which are formed in the extension implantation step (an example of the digital side second conductivity type impurity layer forming step).

Although, in the above-described second embodiment, the digital side second conductivity type impurity layer forming step and the analog side second conductivity type impurity layer forming step are performed simultaneously in the extension implantation step, the present invention is not limited to the configuration. For example, in the extension implantation step, the digital side second conductivity type impurity layer forming step and the analog side second conductivity type impurity layer forming step may be performed separately.

In this case, in the extension implantation step, extension implantation conditions for the digital circuit forming area DA and the analog circuit forming area AA may be set separately by adding a mask in order to reduce the degree of transient enhanced diffusion in the analog circuit forming area AA. In other words, in the digital side second conductivity type impurity layer forming step, after a resist mask that covers the analog circuit forming area AA and opens at the digital circuit forming area DA has been formed on the whole surface of the semiconductor wafer 2w, the extension implantation is performed by ion implanting impurities of the second conductivity type into the well layer 61 using the gate electrode 63 as a mask. Similarly, in the analog side second conductivity type impurity layer forming step, after a resist mask that covers the digital circuit forming area DA and opens at the analog circuit forming area AA has been formed on the whole surface of the semiconductor wafer 2w, the extension implantation is performed by ion implanting impurities of the second conductivity type into the non-doped epi-silicon film 87 using the gate electrode 83 as a mask.

Further, extension implantation conditions for the source region side and the drain region side in the analog circuit forming area AA may be set separately. In this case, in the analog side second conductivity type impurity layer forming step, after a resist mask that covers at least the digital circuit forming area DA and a predetermined region in the analog circuit forming area AA that eventually serves as the drain region 85d and opens at at least a predetermined region in the analog circuit forming area AA that eventually serves as the source region 85s has been formed on the whole surface of the semiconductor wafer 2w, the extension implantation is performed by ion implanting impurities of the second conductivity type into the non-doped epi-silicon film 87. Similarly, in the analog side second conductivity type impurity layer forming step, after a resist mask that covers at least the digital circuit forming area DA and a predetermined region in the analog circuit forming area AA that eventually serves as the source region 85s and opens at at least a predetermined region in the analog circuit forming area AA that eventually serves as the drain region 85d has been formed on the whole surface of the semiconductor wafer 2w, the extension implantation is performed by ion implanting impurities of the second conductivity type into the non-doped epi-silicon film 87.

Although, in the above-described second embodiment, the source region 65s and the drain region 65d and the source region 85s and the drain region 85d are formed simultaneously by simultaneously implanting impurities of the second conductivity type into the digital circuit forming area DA and the analog circuit forming area AA in the source/drain forming step, the present invention is not limited to the configuration.

For example, the source/drain forming step may include a first source/drain forming step of forming the source region 65s and the drain region 65d by implanting impurities of the second conductivity type into the well layer 61 using the gate electrode 63 and the sidewall 64 as a mask and a second drain/source forming step of forming the source region 85s and the drain region 85d by implanting impurities of the second conductivity type into the second conductivity type impurity layer 81 using the gate electrode 83 and the sidewall 84 as a mask more shallowly than the impurities of the second conductivity type implanted in the first source/drain forming step. In this case, when impurities of the second conductivity type are implanted into the well layer 61, after a resist mask that covers the analog circuit forming area AA and opens at the digital circuit forming area DA has been formed on the whole surface of the semiconductor wafer 2w, the impurities of the second conductivity type are implanted into the well layer 61. Similarly, when impurities of the second conductivity type are implanted into the well layer 81, after a resist mask that covers the digital circuit forming area DA and opens at the analog circuit forming area AA has been formed on the whole surface of the semiconductor wafer 2w, the impurities of the second conductivity type are implanted into the well layer 81.

The present invention was described above through embodiments thereof, but the technical scope of the present invention is not limited to that described in the above-described embodiments. The above-described embodiments may be subjected to various alterations and improvements, and it is apparent from the description in the claims that embodiments subjected to such alterations and improvements may also be included in the technical scope of the present invention.

REFERENCE SIGNS LIST 1, 11 Semiconductor device
12, 42a, 42b Insulating film
2, 3 Semiconductor substrate
2w, 3w Semiconductor wafer
4, 5 Element separation layer
6, 7 Digital circuit N-type MOS transistor
8, 9 Analog circuit N-type MOS transistor
21, 31 Through film
61, 71, 81, 91 Well layer
61a, 71a First impurity layer
62, 72, 82, 92 Gate insulating film
63, 73, 83, 93 Gate electrode
64, 74, 84, 94 Sidewall
65d, 75d, 85d, 95d Drain region
65s, 75s, 85s, 95s Source region
66, 76, 86, 96 Silicide film
81a, 91a Second impurity layer
87 Non-doped epi-silicon film
651, 652, 751, 752, 851, 852, 951, 952 Extension region
651a, 652a, 751a, 752a, 851a, 852a, 951a, 952a Second conductivity type impurity layer
653, 753, 853, 953 Deep source region
653a, 654a, 753a, 754a, 853a, 854a, 953a, 954a Second conductivity type deep impurity layer
654, 754, 854, 954 Deep drain region
AA Analog circuit forming area
DA Digital circuit forming area
RM21, RM61, RM71, RM75, RM81, RM91, RM95a, RM95b, RM750,
RM950a, RM950b, RM951, RM952 Resist mask

The invention claimed is:

1. A manufacturing method of a semiconductor device, comprising:
    forming an element separation layer on a semiconductor substrate;
    forming a first well layer by implanting impurities of a first conductivity type into a digital circuit forming area of the semiconductor substrate;
    forming a second well layer by implanting impurities of the first conductivity type into an analog circuit forming area of the semiconductor substrate, which is separated from the digital circuit forming area by the element separation layer;
    forming a gate insulating film on a surface of the semiconductor substrate;
    forming a first gate electrode on a surface of the gate insulating film in the digital circuit forming area and forming a second gate electrode on the surface of the gate insulating film in the analog circuit forming area;
    forming a digital side second conductivity type impurity layer by implanting impurities of a second conductivity type into the first well layer using the first gate electrode as a mask;
    forming an analog side second conductivity type impurity layer by implanting impurities of the second conductivity type into the second well layer using the second gate electrode as a mask;
    forming sidewalls made of insulating films on side surfaces of respective ones of the first gate electrode and the second gate electrode;
    forming a first source region and a first drain region by implanting impurities of the second conductivity type into the digital side second conductivity type impurity layer using the first gate electrode and the sidewall as a mask;
    forming a second source region and a second drain region by implanting impurities of the second conductivity type into the analog side second conductivity type impurity layer using the second gate electrode and the sidewall as a mask more shallowly than the impurities of the second conductivity type implanted in the forming the first source region and the first drain region; and
    forming silicide films on surfaces of the first source region, the first drain region, and the first gate electrode and the second source region, the second drain region, and the second gate electrode.

2. The manufacturing method of the semiconductor device according to claim 1, wherein
    in the forming the analog side second conductivity type impurity layer, the implantation amount of the impurities of the second conductivity type is set smaller than that in the forming the digital side second conductivity type impurity layer.

3. The manufacturing method of the semiconductor device according to claim 1, wherein
    in the forming the digital side second conductivity type impurity layer, arsenic is used as the impurities of the second conductivity type, and
    in the forming the analog side second conductivity type impurity layer, phosphorus is used as the impurities of the second conductivity type.

4. The manufacturing method of the semiconductor device according to claim 1, wherein
    in the forming the second source region and the second drain region, the implantation amount of the impurities of the second conductivity type is set smaller than that in the forming the first source region and the first drain region.

5. The manufacturing method of the semiconductor device according to claim 1, wherein
    in the forming the second well layer, fluorine or carbon is co-implanted in conjunction with the impurities of the first conductivity type.

6. The manufacturing method of the semiconductor device according to claim 1, wherein
    in at least one of the forming the analog side second conductivity type impurity layer and the forming the second source region and the second drain region, fluorine or carbon is co-implanted in conjunction with the impurities of the second conductivity type.

7. The manufacturing method of the semiconductor device according to claim 1, wherein
    in the forming the second well layer, the impurities of the first conductivity type are implanted so that concentration of the impurities of the first conductivity type increases in a depth direction of the semiconductor substrate.

8. A manufacturing method of a semiconductor device, comprising:
    forming an element separation layer on a semiconductor substrate;
    forming a first well layer by implanting impurities of a first conductivity type into a digital circuit forming area of the semiconductor substrate;
    forming a second well layer by implanting impurities of the first conductivity type into an analog circuit forming area of the semiconductor substrate, which is separated from the digital circuit forming area by the element separation layer;

forming a non-doped film by selectively growing the non-doped film on a surface of the semiconductor substrate in the analog circuit forming area;

forming gate insulating films on a surface of the semiconductor substrate in the digital circuit forming area and a surface of the non-doped film in the analog circuit forming area;

forming a first gate electrode on a surface of the gate insulating film in the digital circuit forming area and forming a second gate electrode on a surface of the gate insulating film in the analog circuit forming area;

forming a digital side second conductivity type impurity layer and an analog side second conductivity type impurity layer by implanting impurities of a second conductivity type into the first well layer and the non-doped film with a mean range shallower than or equal to thickness of the non-doped film;

forming sidewalls made of insulating films on side surfaces of respective ones of the first gate electrode and the second gate electrode;

forming a first source region and a first drain region in the digital side second conductivity type impurity layer and forming a second source region and a second drain region in the analog side second conductivity type impurity layer by implanting impurities of the second conductivity type into the digital side second conductivity type impurity layer and the analog side second conductivity type impurity layer using the first gate electrode, the second gate electrode, and the sidewalls as masks; and forming silicide films on surfaces of the first source region, the first drain region, and the first gate electrode and the second source region, the second drain region, and the second gate electrode.

9. The manufacturing method of the semiconductor device according to claim 8, wherein
the forming the digital side second conductivity type impurity layer and the analog side second conductivity type impurity layer includes:
forming the digital side second conductivity type impurity layer by implanting impurities of the second conductivity type into the first well layer using the first gate electrode as a mask; and
forming the analog side second conductivity type impurity layer by implanting impurities of the second conductivity type into the second well layer using the second gate electrode as a mask.

10. The manufacturing method of the semiconductor device according to claim 8, wherein
the forming the first source region, the first drain region, the second source region, and a second drain region includes:
forming the first source region and the first drain region by implanting the impurities of the second conductivity type into the digital side second conductivity type impurity layer using the first gate electrode and the sidewall as a mask; and
forming the second source region and the second drain region by implanting impurities of the second conductivity type into the analog side second conductivity type impurity layer using the second gate electrode and the sidewall as a mask more shallowly than the impurities of the second conductivity type implanted in the forming the first source region and the first drain region.

11. A semiconductor device, comprising:
an element separation layer formed on a semiconductor substrate to separate the semiconductor substrate into a digital circuit forming area and an analog circuit forming area;
a first well layer of a first conductivity type formed in the digital circuit forming area;
a second well layer of the first conductivity type formed in the analog circuit forming area;
a first gate insulating film formed on a surface of the first well layer;
a second gate insulating film formed on a surface of the second well layer;
a first gate electrode formed on a surface of the first gate insulating film;
a second gate electrode formed on a surface of the second gate insulating film;
sidewalls formed of insulating films on side surfaces of respective ones of the first gate electrode and the second gate electrode;
a first source region and a first drain region of a second conductivity type formed in the first well layer with the first gate electrode interposed therebetween;
a second source region and a second drain region of the second conductivity type formed in the second well layer with the second gate electrode interposed therebetween and have a shallower depth from a surface of the semiconductor substrate than the first source region and the first drain region; and
silicide films formed on surfaces of the first source region, the first drain region, and the first gate electrode and the second source region, the second drain region, and the second gate electrode.

12. A semiconductor device, comprising:
an element separation layer formed on a semiconductor substrate to separate the semiconductor substrate into a digital circuit forming area and an analog circuit forming area;
a first well layer of a first conductivity type formed in the digital circuit forming area;
a second well layer of the first conductivity type formed in the analog circuit forming area;
a non-doped film formed on a surface of the second well layer;
a first gate insulating film formed on a surface of the first well layer;
a second gate insulating film formed on a surface of the non-doped film;
a first gate electrode formed on a surface of the first gate insulating film;
a second gate electrode formed on a surface of the second gate insulating film;
sidewalls formed of insulating films on side surfaces of respective ones of the first gate electrode and the second gate electrode;
a first source region and a first drain region of a second conductivity type formed in the first well layer with the first gate electrode interposed therebetween;
a second source region and a second drain region of the second conductivity type formed in the non-doped film and the second well layer with the second gate electrode interposed therebetween; and
silicide films formed on surfaces of the first source region, the first drain region, and the first gate electrode and the second source region, the second drain region, and the second gate electrode.

* * * * *